US012383971B2

(12) United States Patent
Ikeda et al.

(10) Patent No.: US 12,383,971 B2
(45) Date of Patent: Aug. 12, 2025

(54) SOLDER CUTTING DEVICE, SOLDER CUTTING UNIT, PART MOUNTING DEVICE, AND PRODUCTION SYSTEM

(71) Applicant: HIRATA CORPORATION, Kumamoto (JP)

(72) Inventors: Toshiomi Ikeda, Kumamoto (JP); Tetsunori Matsuyoshi, Kumamoto (JP)

(73) Assignee: HIRATA CORPORATION, Kumamoto (JP)

( * ) Notice: Subject to any disclaimer, the term of this patent is extended or adjusted under 35 U.S.C. 154(b) by 502 days.

(21) Appl. No.: 17/951,105

(22) Filed: Sep. 23, 2022

(65) Prior Publication Data

US 2023/0017361 A1 Jan. 19, 2023

Related U.S. Application Data

(63) Continuation of application No. PCT/JP2020/015378, filed on Apr. 3, 2020.

(51) Int. Cl.
 *B23K 1/018* (2006.01)
 *B23K 3/06* (2006.01)
 (Continued)

(52) U.S. Cl.
 CPC ............ *B23K 3/06* (2013.01); *B26D 1/06* (2013.01); *B23K 2103/00* (2018.08)

(58) Field of Classification Search
 CPC .......... B26D 1/06; B23K 3/0607; B23K 3/08; B23K 3/0623; B23K 3/063; B23D 15/00–14
 (Continued)

(56) References Cited

U.S. PATENT DOCUMENTS 3,974,954 A * 8/1976 Brenan .............. B23K 11/0033
 219/79
4,089,106 A * 5/1978 Seidler .................. H01R 43/16
 228/5.1
 (Continued)

FOREIGN PATENT DOCUMENTS

CN 102470493 5/2012
CN 107427947 12/2017
 (Continued)

OTHER PUBLICATIONS

"International Search Report (Form PCT/ISA/210) of PCT/JP2020/015378", mailed on Jun. 30, 2020, with English translation thereof, pp. 1-4.
 (Continued)

*Primary Examiner* — Keith Walker
*Assistant Examiner* — Carlos J Gamino
(74) *Attorney, Agent, or Firm* — JCIPRNET

(57) ABSTRACT

A solder cutting device includes a first holding part, a first drive part that feeds a tape-like solder material held by the first holding part in a first direction, a cutting part for cutting the tape-like solder material, and a second drive part that actuates the cutting part. The first drive part is a first actuator that is electrically-driven and that converts a rotational motion of a rotating body, the axis of which extends in the first direction, into a motion in the first direction. The second drive part includes a second actuator that moves a moving body in the first direction, and a connection portion that converts the motion of the moving body into a motion in a second direction and transmits the motion to the cutting part.

12 Claims, 16 Drawing Sheets

(51) Int. Cl.
*B26D 1/06* (2006.01)
*B23K 103/00* (2006.01)

(58) Field of Classification Search
USPC .......................................................... 228/13
See application file for complete search history.

(56) References Cited

U.S. PATENT DOCUMENTS

| | | | | |
|---|---|---|---|---|
| 8,011,557 | B1 * | 9/2011 | Zhang | B23K 3/063 |
| | | | | 228/43 |
| 8,141,766 | B1 * | 3/2012 | Wei | B23K 1/0016 |
| | | | | 228/43 |
| 12,083,626 | B2 * | 9/2024 | Ikeda | B23K 3/08 |
| 2012/0305297 | A1 | 12/2012 | Nomoto et al. | |
| 2020/0070276 | A1 * | 3/2020 | Ou | H01R 43/0263 |
| 2023/0405706 | A1 * | 12/2023 | Cyphert | B23K 20/10 |
| 2024/0058877 | A1 * | 2/2024 | Lu | B23D 33/08 |

FOREIGN PATENT DOCUMENTS

| | | |
|---|---|---|
| JP | S5868943 | 4/1983 |
| JP | S60130643 | 9/1985 |
| JP | S6444270 | 2/1989 |
| JP | H05245627 | 9/1993 |
| JP | 2004216426 | 8/2004 |
| JP | 2005074483 A * | 3/2005 |
| JP | 2006130538 | 5/2006 |
| JP | 2008288334 | 11/2008 |
| JP | 2009095834 A * | 5/2009 |
| JP | 4390067 B2 * | 12/2009 |
| JP | 2010125477 | 6/2010 |
| JP | 2015166096 | 9/2015 |
| TW | 201143956 | 12/2011 |

OTHER PUBLICATIONS

Beijing Electronics Science & Technology Institute, "Fundamentals of the Design of Electronic Special Mechanical Equipment", National Defense Industry Press, Jun. 1980, with partial English translation, pp. 1-7.

"Office Action of China Counterpart Application", issued on Jul. 11, 2023, with English translation thereof, pp. 1-23.

"Search Report of Europe Counterpart Application", issued on Feb. 23, 2023, pp. 1-8.

* cited by examiner

SOLDER CUTTING DEVICE, SOLDER CUTTING UNIT, PART MOUNTING DEVICE, AND PRODUCTION SYSTEM

CROSS-REFERENCE TO RELATED APPLICATION

This application is a continuation of PCT International Application No. PCT/JP2020/015378, filed on Apr. 3, 2020, the entire disclosure of which is expressly incorporated by reference herein.

BACKGROUND

Technical Field

The present invention relates to a solder cutting device that cuts a tape-like solder material into a solder piece, a solder cutting unit, a part mounting device, and a production system.

Related Art

Conventionally, in a production system including a soldering process, a solder cutting device that cuts a long tape-like solder material into a solder piece, for example, has been used. In a solder supply device described in Patent Document 1 (Japanese Patent No. 4838195), a tape-like solder material (sheet-shaped solder tape) wound around a reel is pulled out from the reel by a sending device via a bridging device, sent to a cutting part, and cut by the cutting part into a solder piece.

The bridging device and the sending device are respectively composed of a plurality of rollers forming a sending path of the sheet-shaped solder tape. A sending roller of the sending device is driven by a first motor to rotate to send out the sheet-shaped solder tape. In the cutting part, a cam is rotated by a second motor, and a punch disposed on the sending path is moved up and down by the cam to cut the sheet-shaped solder tape. Driving force is transmitted from the second motor to the cam via a timing belt.

However, in the above conventional configuration, directions of a shaft of each roller of the bridging device and the sending device, a shaft of the cam, and output shafts of the first and second motors are all a width direction of the tape-like solder material, which is a direction orthogonal to a sending direction of the tape-like solder material. Each drive source that drives the output shafts of the first and second motors is configured on one side of each output shaft. Hence, an issue arises that it is necessary that a dimension in a width direction of the bridging device and the sending device be at least an arrangement dimension as large as an entire motor length including the output shaft and the drive source of each of the first and second motors, and a device width of the solder supply device including the bridging device and the sending device including the first and second motors cannot be made smaller than the width of the bridging device and the sending device. This issue leads to a remarkable problem that, regarding a production system including a plurality of solder supply devices arranged in parallel in the width direction, an installation area of the production system in a factory is increased.

SUMMARY

A solder cutting device according to one aspect of the present invention includes: a first holding part, holding and releasing a long tape-like solder material; a first drive part, equipped with the first holding part and causing the tape-like solder material held by the first holding part to be sent linearly in a first direction; a cutting part, including a first cutting member and a second cutting member that face each other and are provided so as to approach and separate from each other, and cutting the tape-like solder material located in a cutting position between the first cutting member and the second cutting member; and a second drive part, actuating at least one of the first cutting member and the second cutting member in a second direction perpendicular to a plane part of the tape-like solder material. The first drive part is a first actuator being electrically-driven and converting a rotational motion of a rotating body whose axis extends in the first direction into a linear motion in the first direction. The second drive part includes a second actuator linearly moving a moving body movable in the first direction, and a transmission mechanism converting the linear motion of the moving body into a linear motion in the second direction and transmitting the same to at least one of the first cutting member and the second cutting member.

Figure 1:
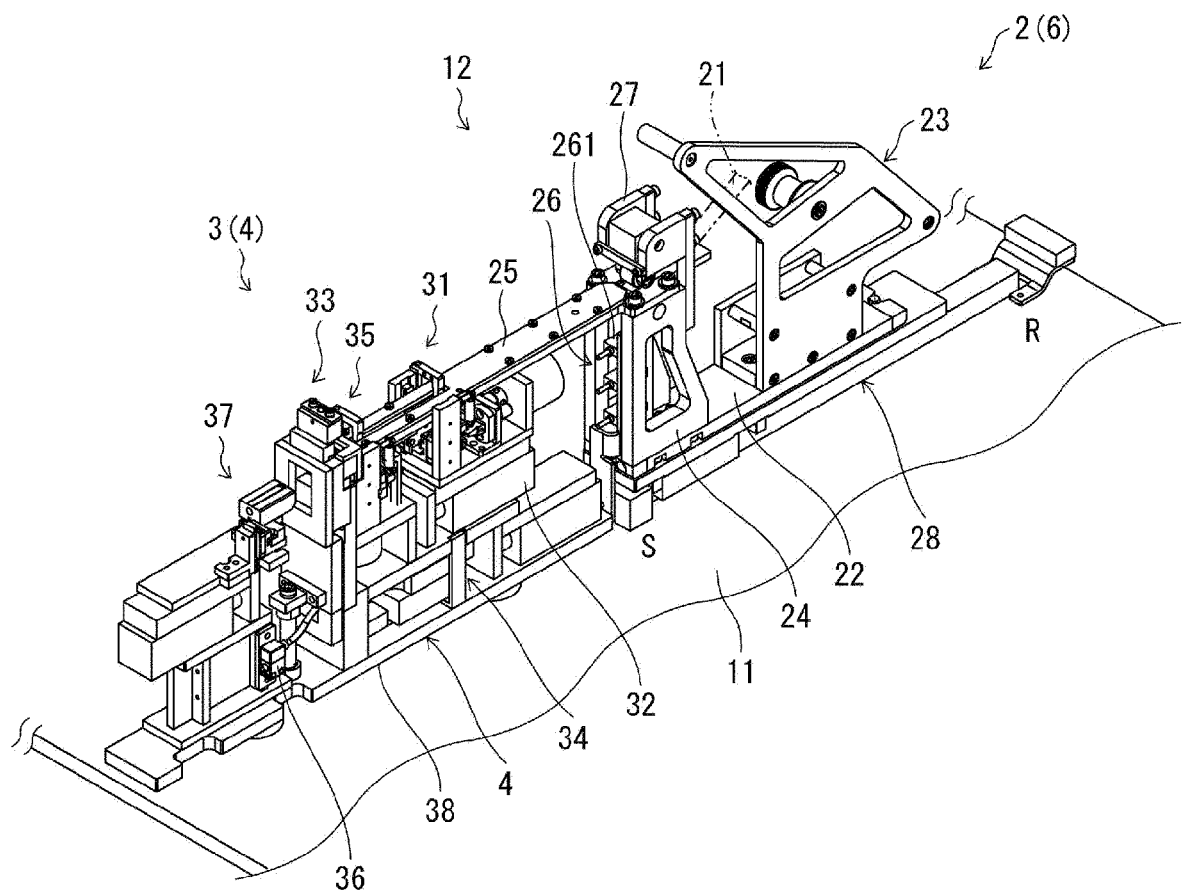
FIG. 1 is a perspective view showing a solder supply unit and a solder cutting device provided in a production system of an embodiment of the present invention.
Figure 2:
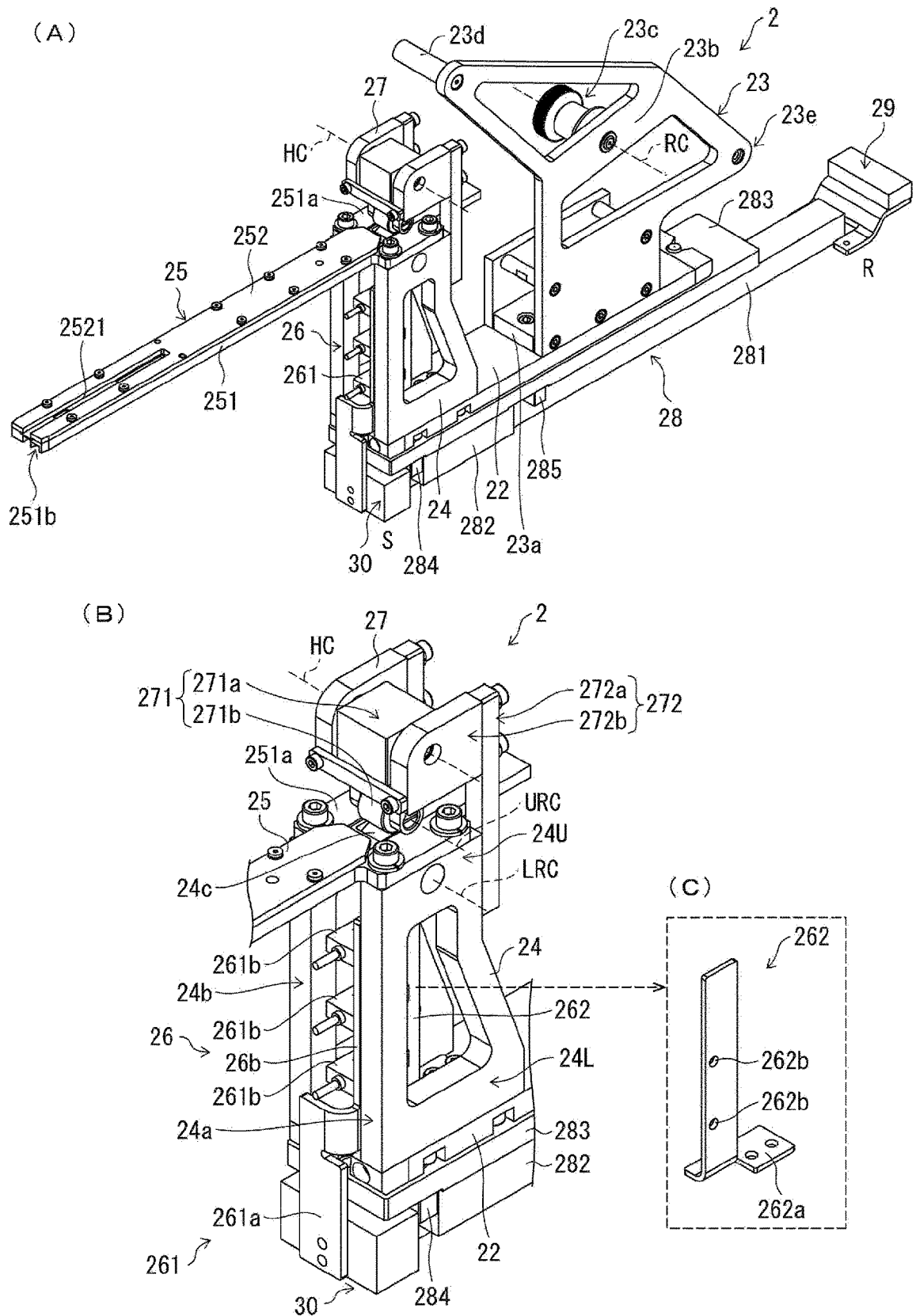

(A) of FIG. 2 is a perspective view of the solder supply unit shown in FIG. 1, (B) of FIG. 2 is a partially enlarged view of a support member in the solder supply unit, and (C) of FIG. 2 is a partially enlarged view of an identification part 262 in (B) of FIG. 2.

Figure 3:
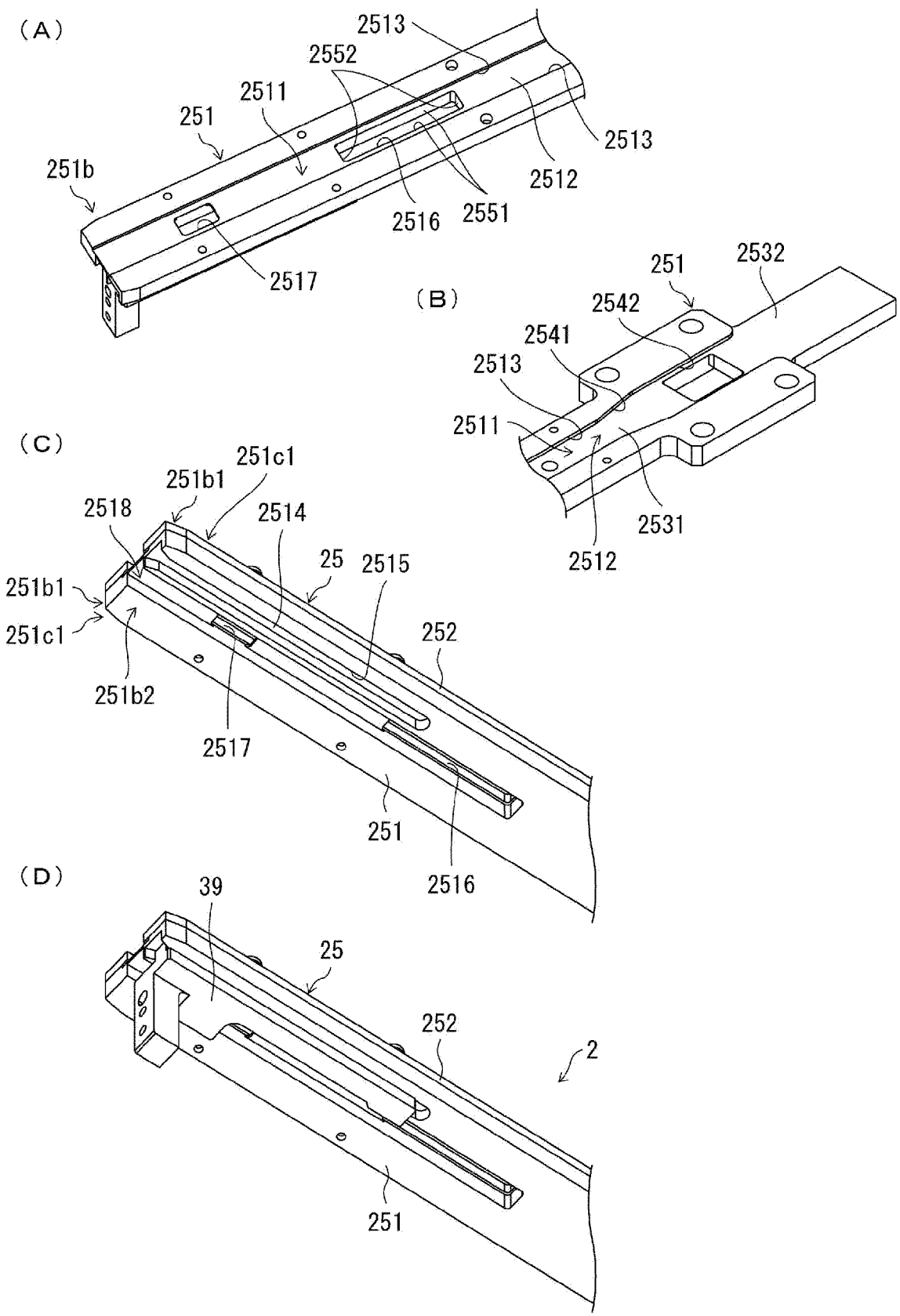

(A) of FIG. 3 is a perspective view showing a shape of a downstream portion of an upper surface of a lower guide member of a guidance member, (B) of FIG. 3 is a perspective view showing a shape of an upstream portion of the upper surface of the lower guide member of the guidance member, (C) of FIG. 3 is a perspective view showing a shape of a lower surface of the lower guide member, and (D) of FIG. 3 is a perspective view showing a state in which an attachment guide member is attached to the lower surface of the lower guide member.

Figure 4:
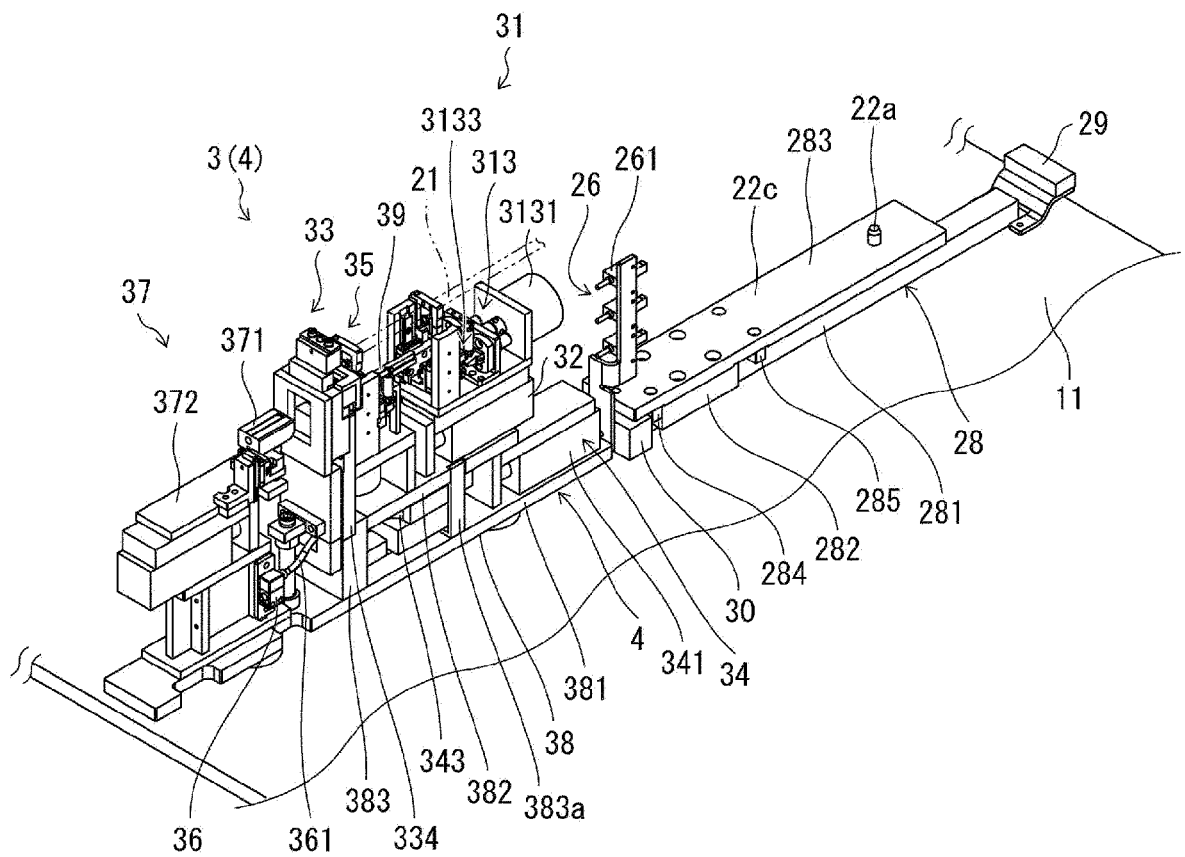

FIG. 4 is a perspective view of the solder cutting device shown in FIG. 1.

Figure 5:
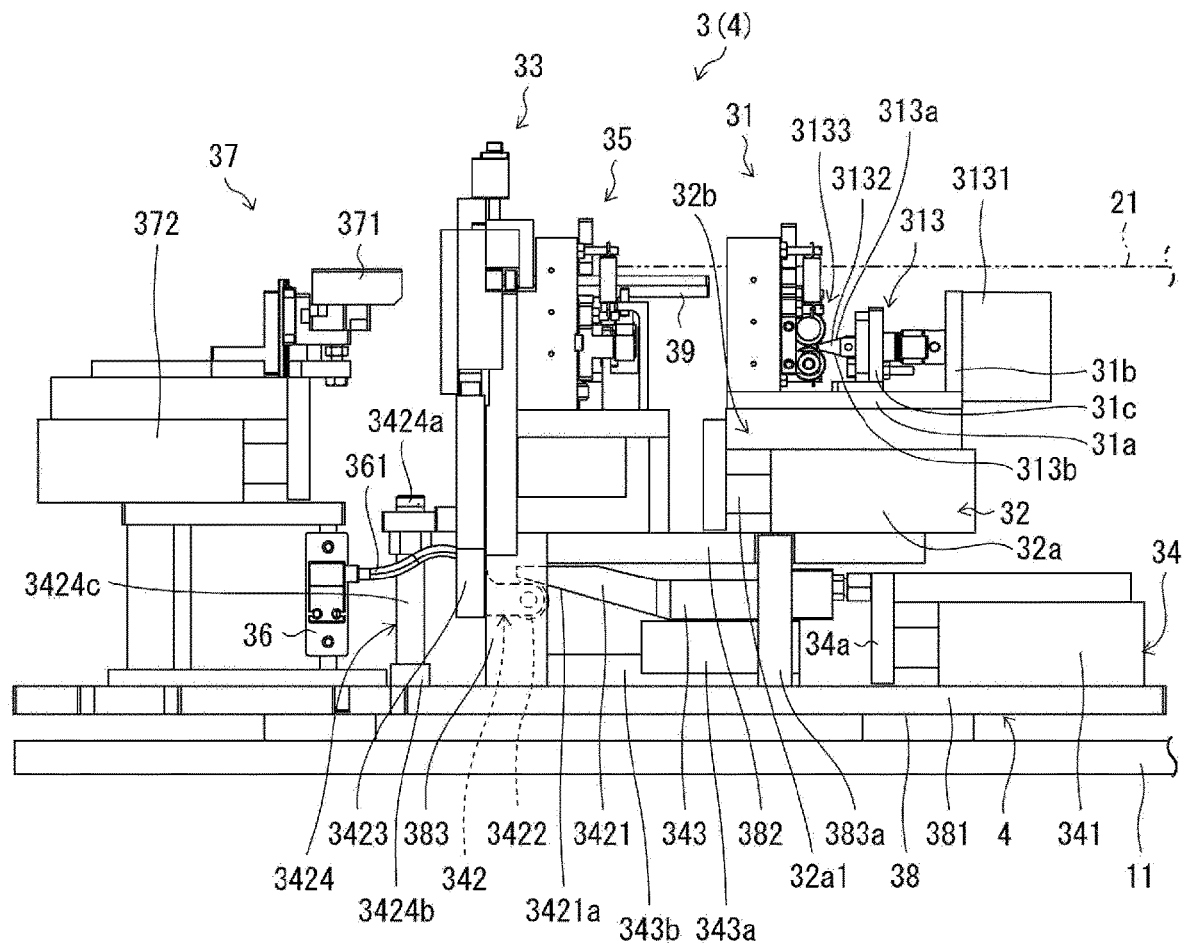

FIG. 5 is a front view of the solder cutting device shown in FIG. 4.

Figure 6:
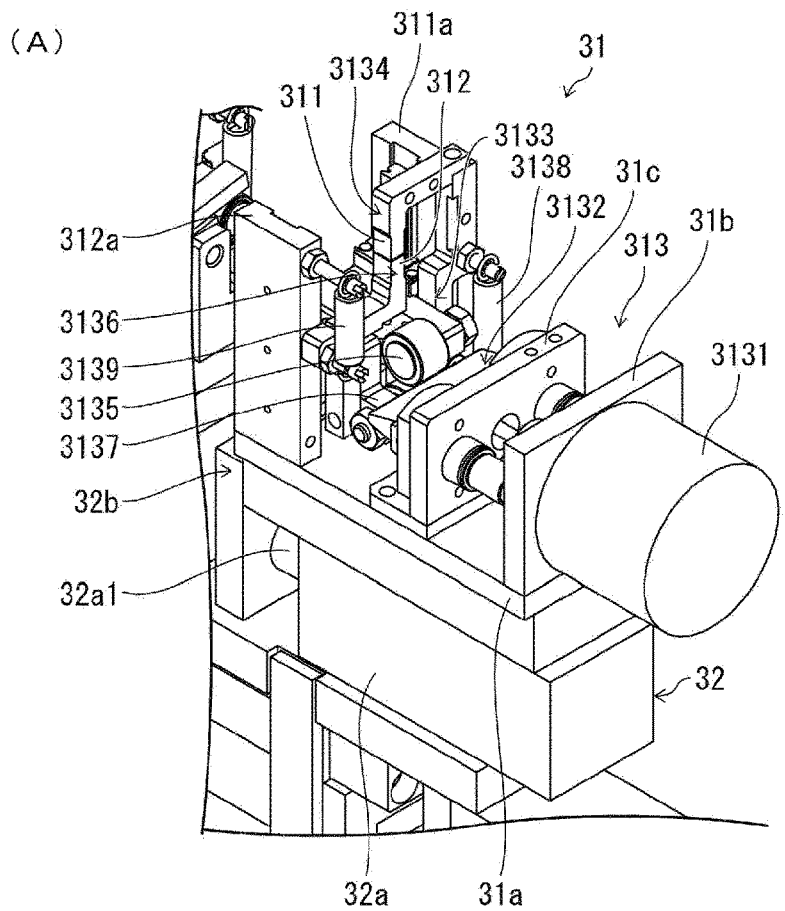
Figure 6:
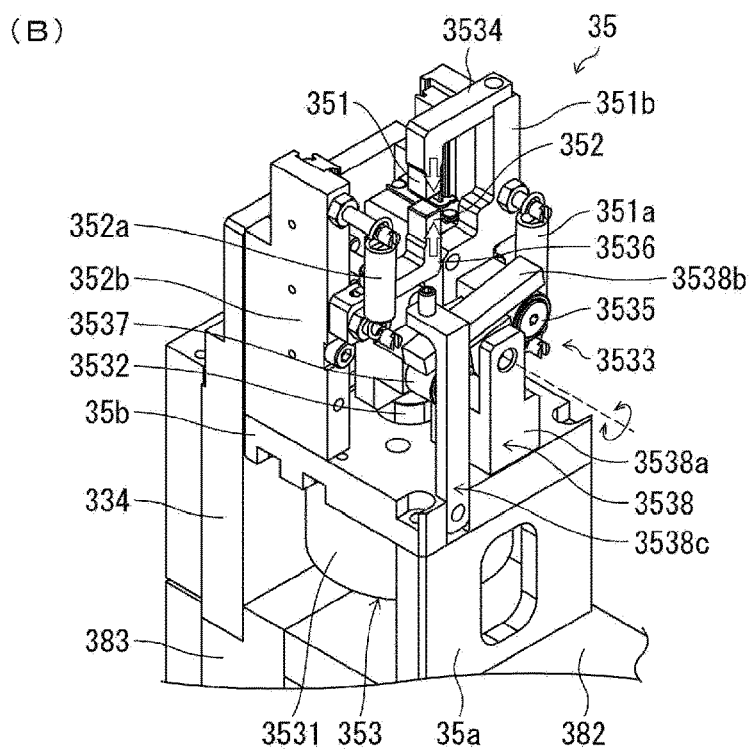

(A) of FIG. 6 is an enlarged perspective view showing a first holding part shown in FIG. 4 and FIG. 5, and (B) of FIG. 6 is an enlarged perspective view showing a second holding part shown in FIG. 4 and FIG. 5.

Figure 7:
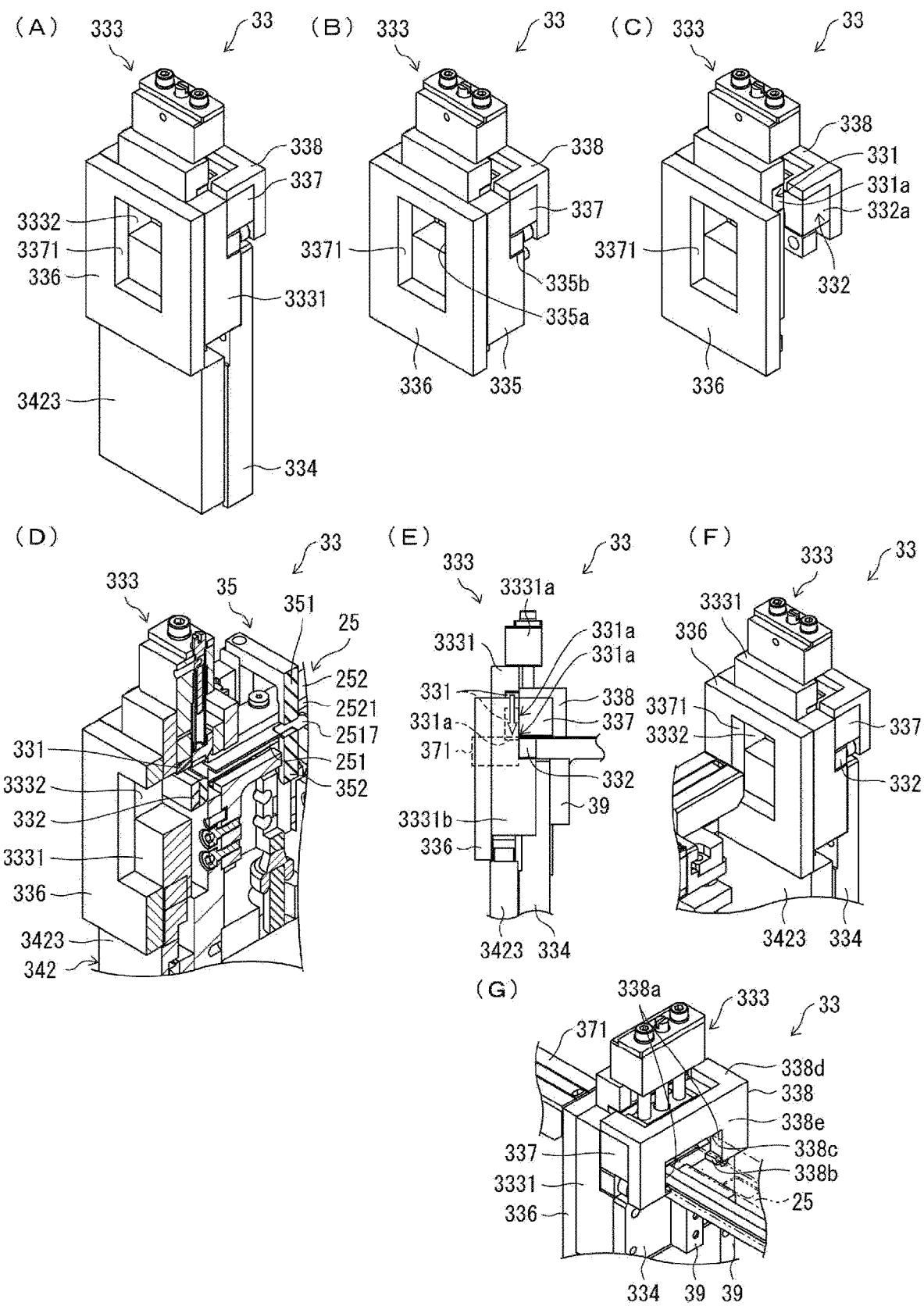

(A) of FIG. 7 is a perspective view of a cutter unit provided in a cutting part, (B) of FIG. 7 is a perspective view of a state in which a support member supporting the cutter unit and a connection member have been removed, (C) of FIG. 7 is a perspective view of a state in which a guide support member has been removed, (D) of FIG. 7 is a longitudinal sectional view of the cutting part and the vicinity of the cutting part, (E) of FIG. 7 is a front view of the cutting part, (F) of FIG. 7 is a perspective view showing a positional relationship between the cutting part and a cut piece holding part, and (G) of FIG. 7 is a perspective view showing a positional relationship between the cutting part and the guidance member.

Figure 8:
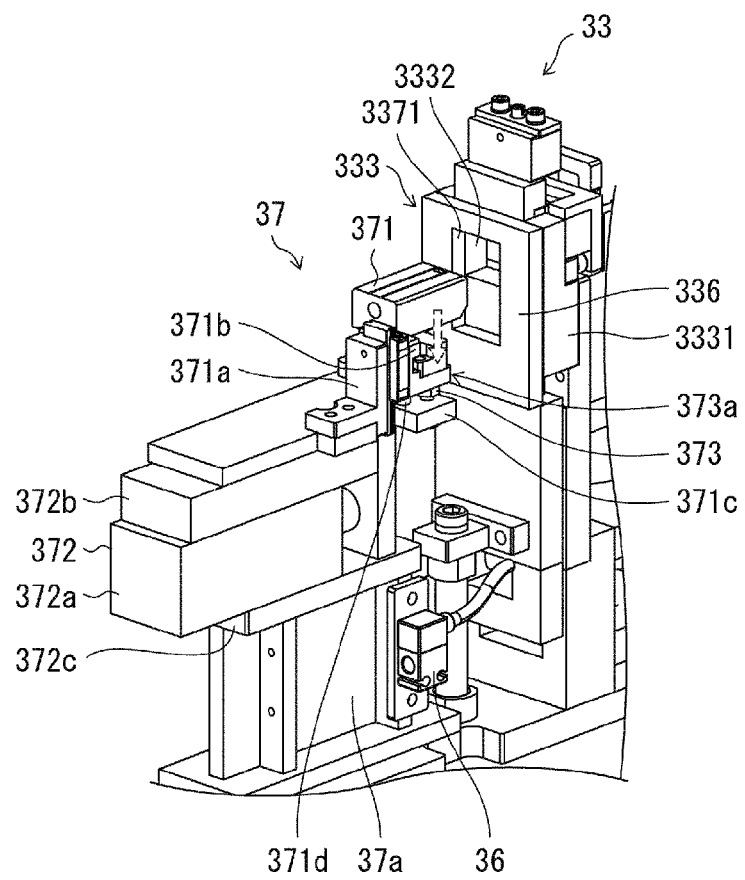

FIG. 8 is an enlarged perspective view showing a cut solder transfer part shown in FIG. 4 and FIG. 5.

Figure 9:
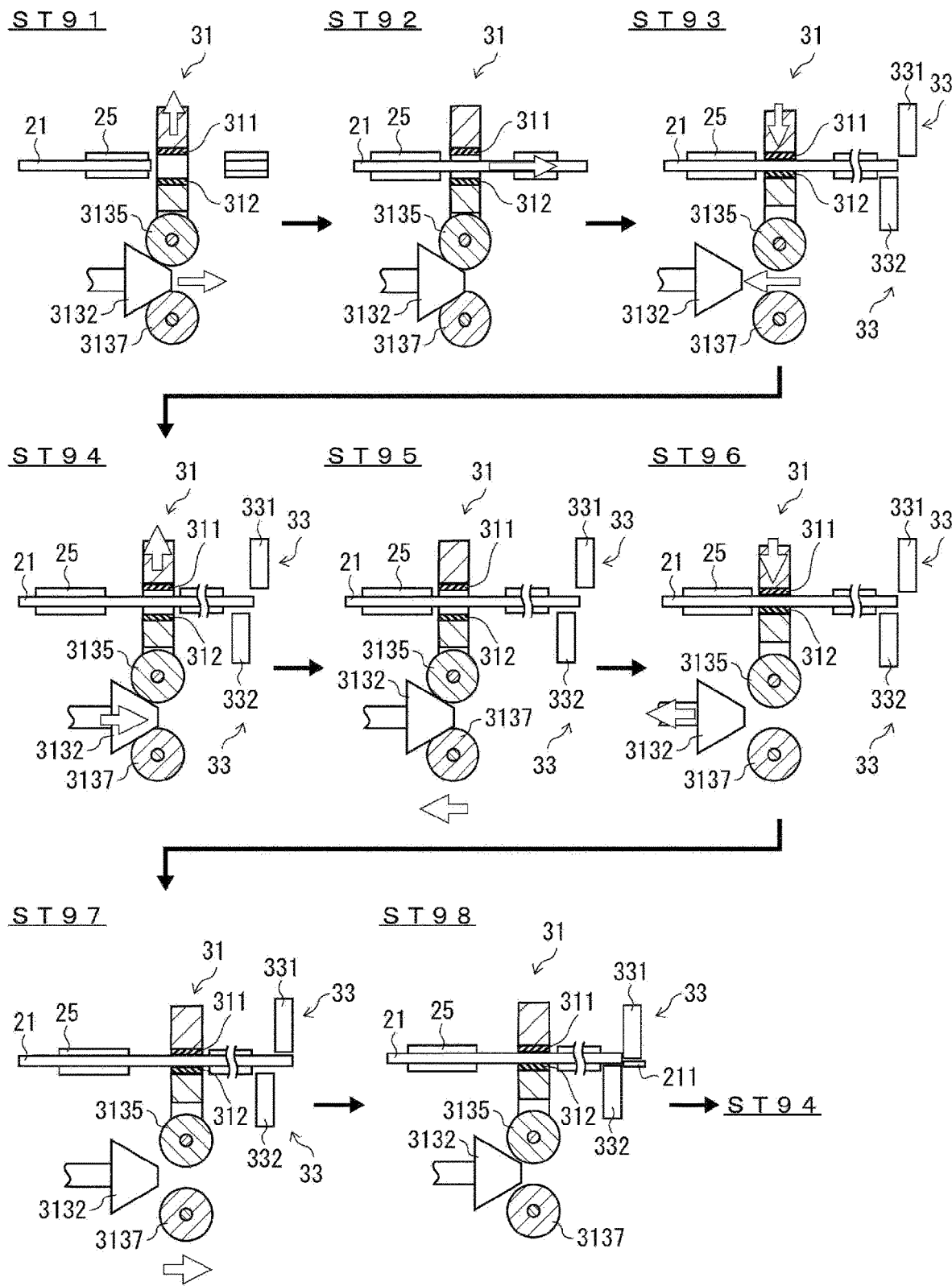

FIG. 9 is an explanatory view of an operation from feeding of a tape-like solder material by the first holding part to cutting of the tape-like solder material by the cutting part in the solder cutting device shown in FIG. 5.

Figure 10:
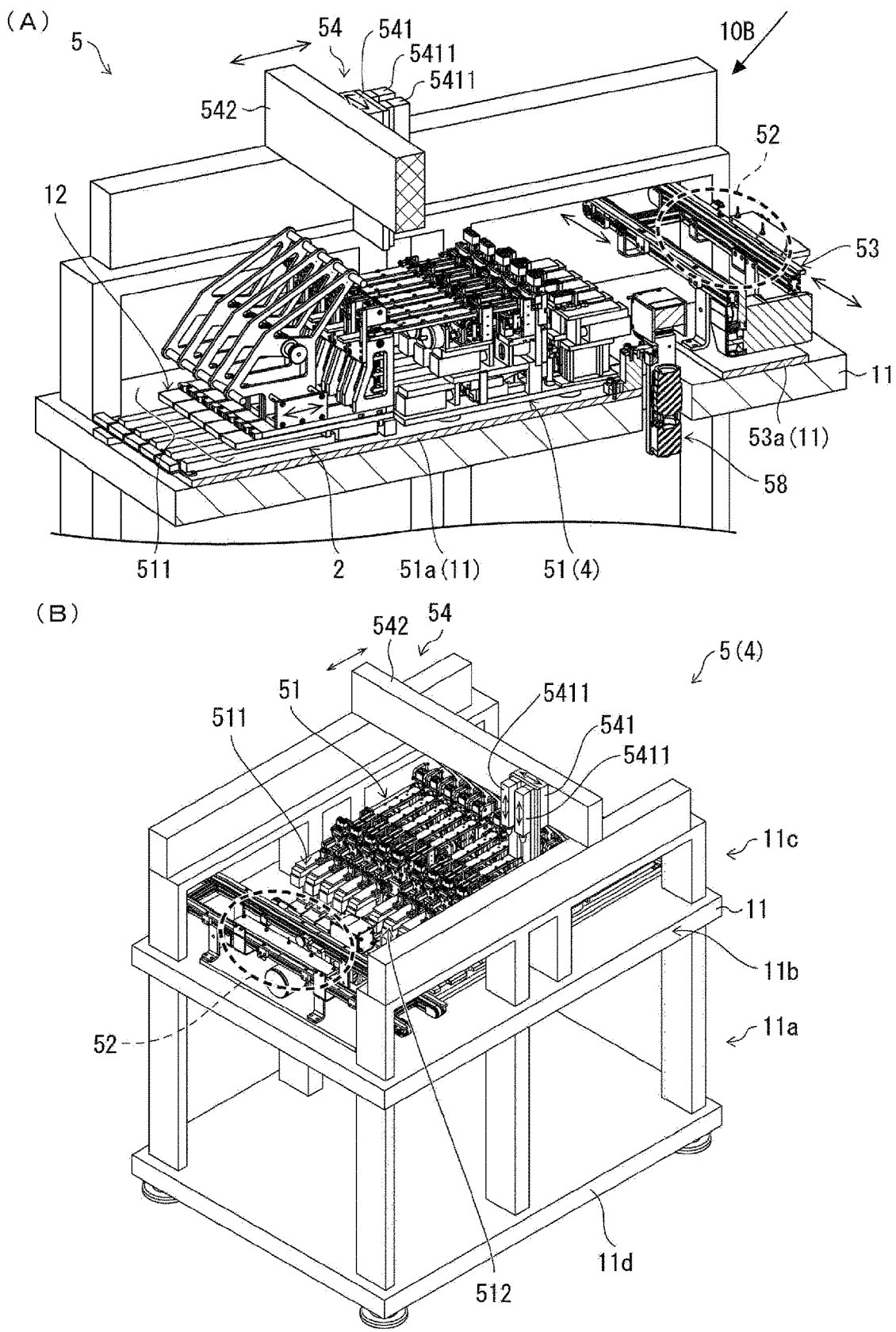

(A) of FIG. 10 is a perspective view showing a part mounting device provided in the production system of an embodiment of the present invention, and (B) of FIG. 10 is a perspective view of the part mounting device of (A) of FIG. 10 taken along a first direction (feeding direction) as viewed from a direction different from that of (A) of FIG. 10.

Figure 11:
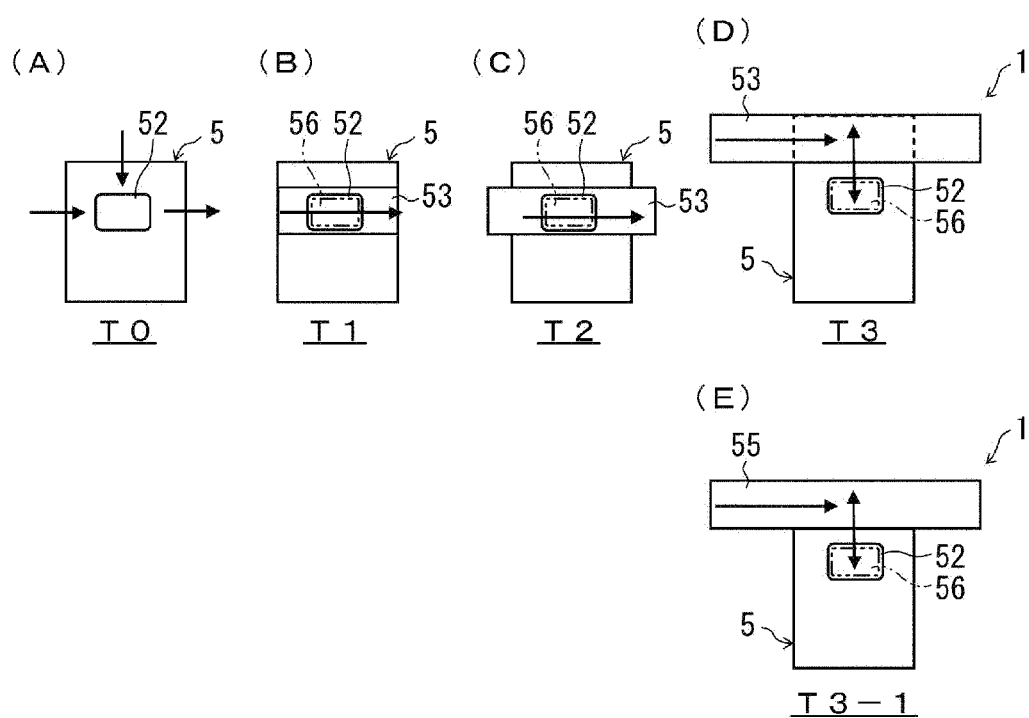

(A) of FIG. 11 to (E) of FIG. 11 are schematic views showing each type of the part mounting device provided in the production system of an embodiment of the present invention.

Figure 12:
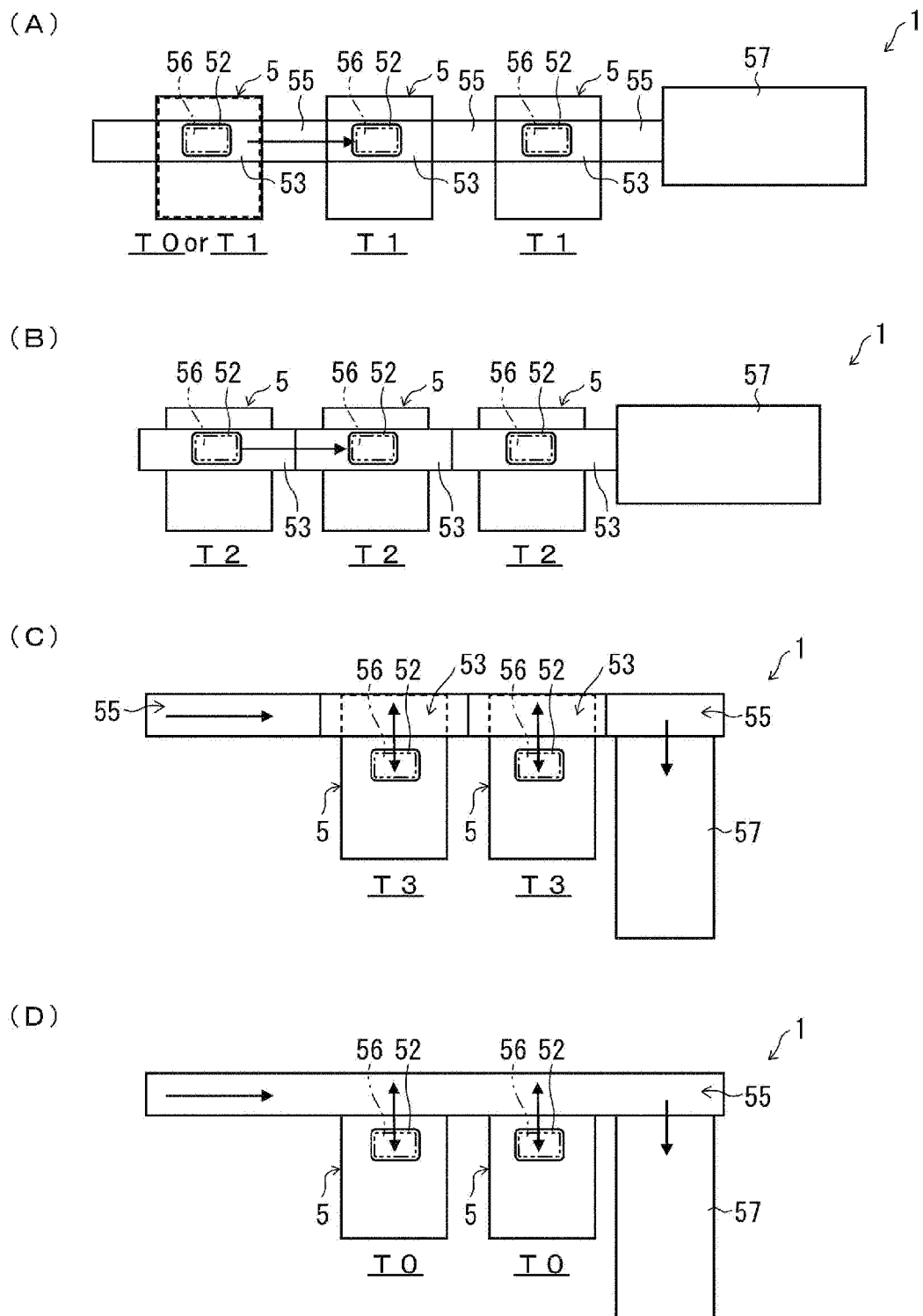

(A) of FIG. 12 to (D) of FIG. 12 are schematic views showing the production system provided with each type of the part mounting device shown in (A) of FIG. 11 to (E) of FIG. 11.

Figure 13:
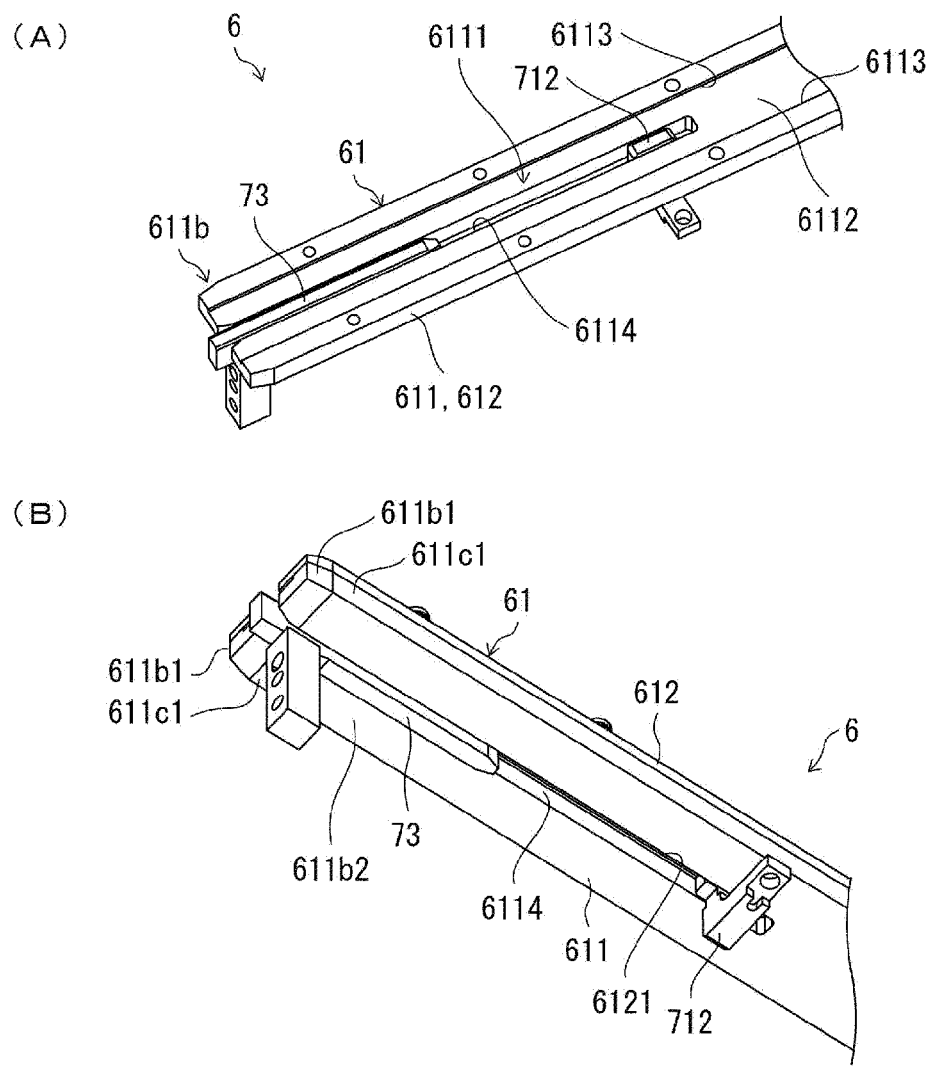

(A) of FIG. 13 is a perspective view showing a shape of the upper surface of the lower guide member of the guidance member provided in the solder supply unit shown in FIG. 1, and showing a state in which the attachment guide member is attached to the lower guide member. (B) of FIG. 13 is a perspective view showing a shape of the lower surface of the lower guide member of the above guidance member, and showing a state in which the attachment guide member is attached to the lower guide member.

Figure 14:
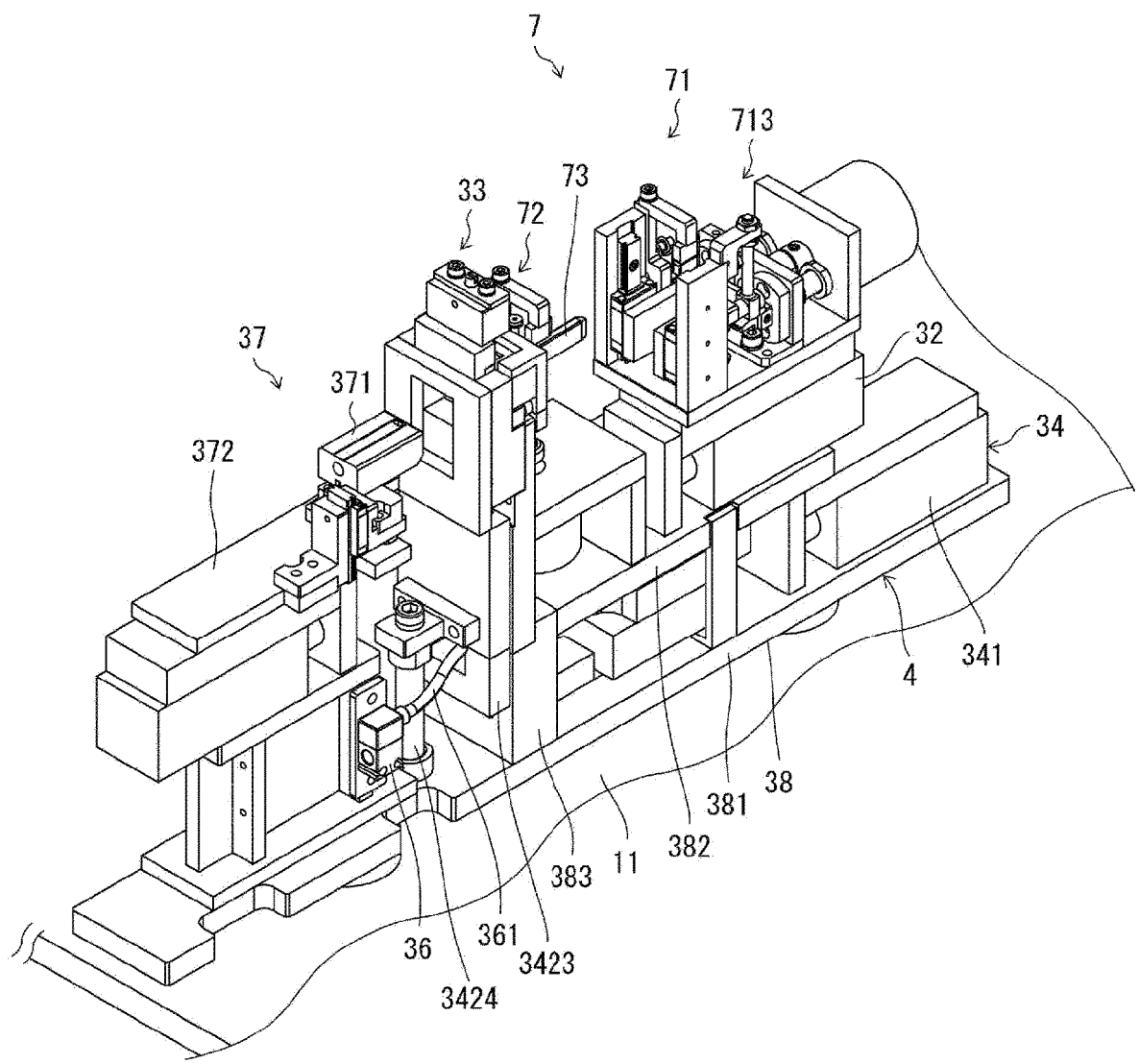

FIG. 14 is a perspective view of a solder cutting device of another embodiment of the present invention.

Figure 15:
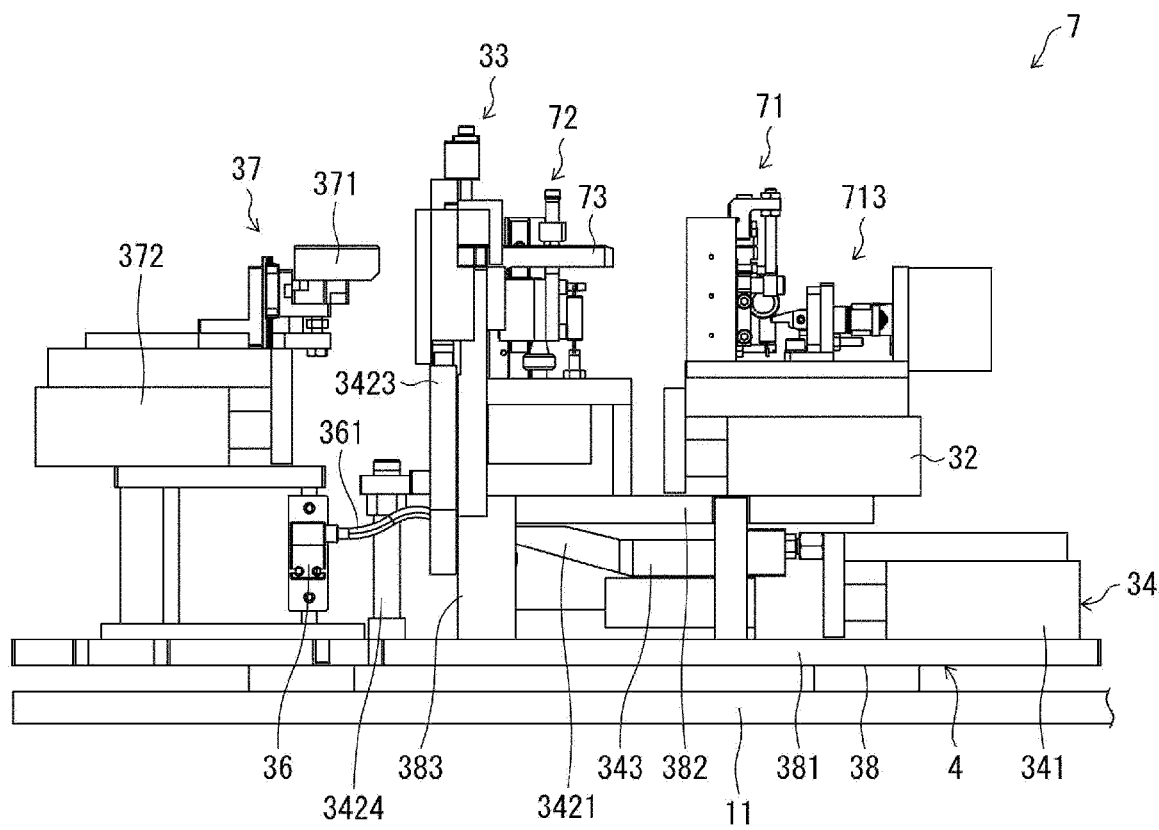

FIG. 15 is a front view of the solder cutting device shown in FIG. 14.

Figure 16:
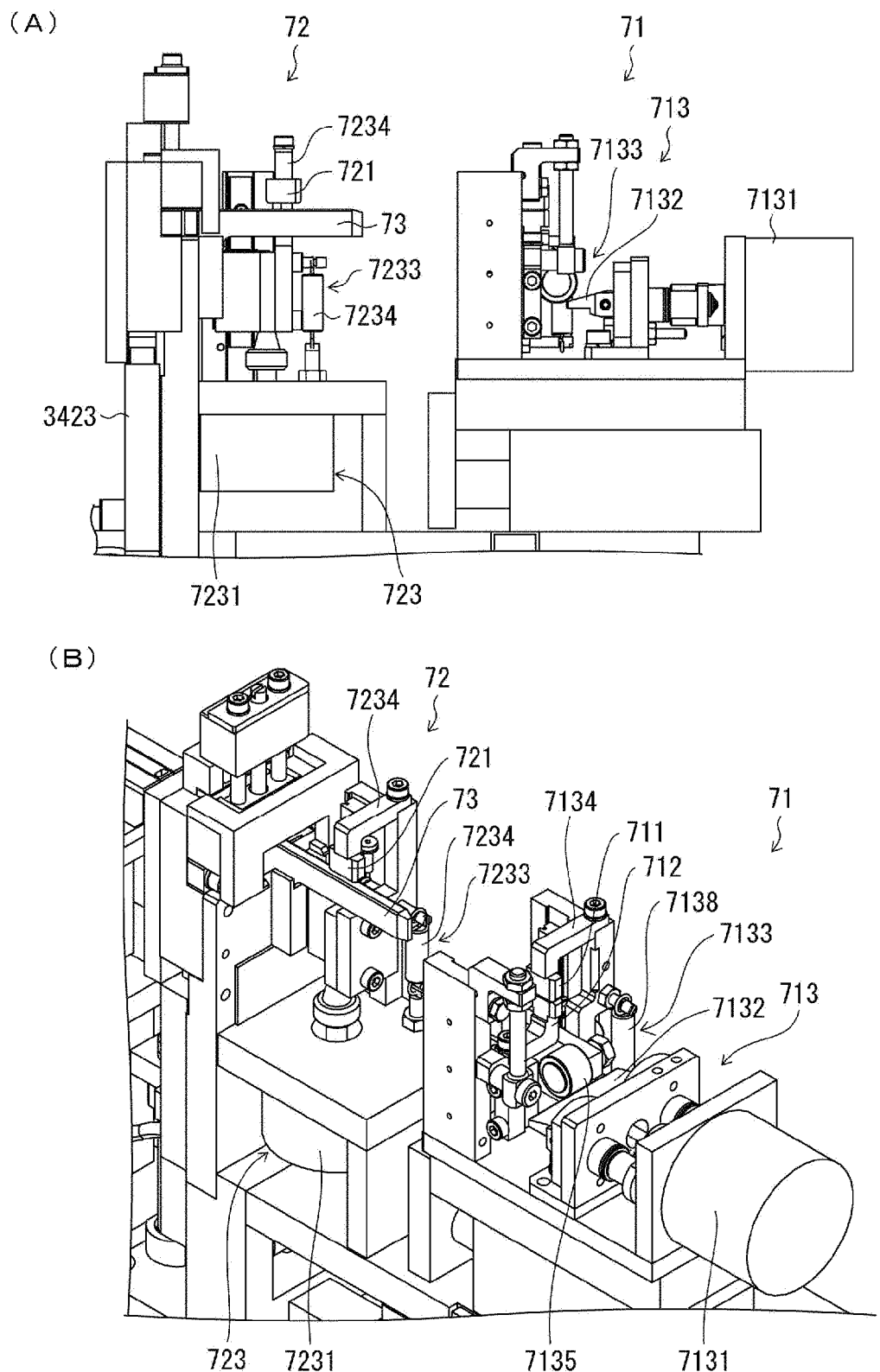

FIG. 16 is an enlarged perspective view showing the first holding part and the second holding part shown in FIG. 14 and FIG. 15.

DESCRIPTION OF THE EMBODIMENTS

The present invention realizes a solder cutting device, a solder cutting unit, a part mounting device and a production system capable of effectively utilizing the installation area.

According to one aspect of the present invention, it is possible to reduce a device width of the solder cutting device in a width direction of the tape-like solder material. Accordingly, in a system including the solder cutting device and using a solder piece supplied from the solder cutting device, even if a plurality of the solder cutting devices are installed in parallel in the width direction, since a device width of the part mounting device can be controlled, the part mounting device can be reduced in size.

Embodiment 1

Hereinafter, an embodiment of the present invention will be described in detail. A production system 1 includes a part mounting device 5 and a temperature processing device 57 shown in (A) of FIG. 12 to (D) of FIG. 12. FIG. 1 is a perspective view showing a solder supply unit 2 and a solder cutting device 3 (solder cutting unit 4) provided in a solder piece manufacturing device 12 included in the part mounting device 5 (see (A) of FIG. 10 and (B) of FIG. 10) configured in the production system 1 (see FIG. 11) of the present embodiment. In the following description, a direction (tip side of a tape-like solder material 21) in which the tape-like solder material 21 is sent, or a direction (side where a solder piece obtained by cutting is taken out) in which a solder piece cut from the tape-like solder material 21 is sent is described as a downstream side, and a direction opposite thereto is described as an upstream side.

The tape-like solder material 21 is formed in a predetermined length, width and thickness. In the present embodiment, the tape-like solder material 21 is prepared and supplied in a state of being wound around a reel (not shown) attached to a reel holder 23 from one end of the tape-like solder material 21 to a tip at the other end so as to overlap in order in a thickness direction and accommodated. The tape-like solder material 21 is formed in which the width (for example, 50 mm or less) is smaller than the length. The tape-like solder material 21 is treated with a surface on one side in the thickness direction as an upper surface and a surface on the other side as a lower surface. In the present embodiment, a surface on an outer peripheral side in the state of being wound on the reel is treated as the lower surface. As the tape-like solder material 21, a plurality of tape-like solder materials of different widths are prepared, wound around reels having widths suitable for each size, and supplied. A tape-like solder material may be prepared in a linearly stretched state without using a reel, and may be supplied while remaining a linear body.

(Solder Supply Unit 2)

(A) of FIG. 2 is a perspective view of the solder supply unit 2 shown in FIG. 1, (B) of FIG. 2 is a partially enlarged view of a support member 24 in the solder supply unit 2, and (C) of FIG. 2 is a partially enlarged view of the identification part 262 in (B) of FIG. 2.

As shown in FIG. 1 and (A) of FIG. 2 to (C) of FIG. 2, the solder supply unit 2 includes a base member 22, the reel holder 23, the support member 24, a guidance member 25, and a suppression unit 27, and supplies the long tape-like solder material 21 held by the reel holder 23 to the solder cutting device 3. The solder supply unit 2 includes an identification area 26.

(Base Member 22)

The base member 22 is an elongated plate-shaped member extending in a feeding direction (hereinafter simply referred to as feeding direction) of the tape-like solder material 21. The base member 22 is supported by a movement mechanism 28 described later, and is provided on a platform 11 so that the solder supply unit 2 is movable in the feeding direction (corresponding to a first direction (X direction)) between an attachment position S provided on the solder cutting unit 4 side and a detachment position R provided away from the solder cutting unit 4.

(Reel Holder 23 and Support Member 24)

The reel holder 23 is provided (on the detachment position R side) on the base member 22, and rotatably holds a reel (not shown) around which the tape-like solder material 21 is wound. The reel holder 23 includes a holder attachment part 23a, a holder support 23b, and a rotation holding member 23c. The holder attachment part 23a is attached to the base member 22. The holder support 23b is provided so as to extend upward on one end side of the holder attachment part 23a orthogonal to the feeding direction, and has a plate shape. The rotation holding member 23c is provided on the holder support 23b and rotatably holds the reel. The reel holder 23 includes a first operation part 23d provided on one side of the holder support 23b and a second operation part 23e provided on the other side of the holder support 23b. The rotation holding member 23c is configured on the holder support 23b to include a rotation axis RC parallel to an axis extending in a direction (width direction) perpendicular to the other surface of the holder support 23b. The rotation axis RC is disposed at the same height position as an extension portion 2512 of the guidance member 25 described later. The first operation part 23d and the second operation part 23e are provided on the holder support 23b with the rotation holding member 23c sandwiched therebetween. The first operation part 23d is disposed above the rotation holding member 23c on the attachment position S side of the holder support 23b. The second operation part 23e is disposed below the rotation holding member 23c on the detachment position R side of the holder support 23b. By providing the first operation part 23d and the second operation part 23e, movement of the movement mechanism 28, that is, reel attachment from a pull-out direction, is facilitated.

The movement mechanism 28 includes: a rail member 281, having a predetermined length in the feeding direction; a moving member 282, configured to be movable on the rail member 281; and an attachment member 283, to which the base member 22 of the solder supply unit 2 is attached. The movement mechanism 28 includes a first restriction member 30 provided on the attachment position S side and restricting movement of the solder supply unit 2 toward the attachment position S side, and a second restriction member 29 provided on the detachment position R side and restricting movement of the solder supply unit 2 toward the detachment position R side.

The rail member 281 is disposed between the attachment position S and the detachment position R and guides movement of the moving member 282.

The moving member 282 is guided by the rail member 281 and is moved between the attachment position S and the detachment position R.

The attachment member 283 is a plate-shaped member of a predetermined length, in which an attachment part (not shown) provided on one side is attached to the moving member 282. The attachment member 283 includes a defining portion 22a defining an attachment position provided on the attachment member 283 when the base member 22 is attached to the attachment member 283, and a mounting portion 22c on which the base member 22 is mounted and fixed (see FIG. 4). When the solder supply unit 2 is removed from the attachment member 283, fixation of the base member 22 to the mounting portion 22c is canceled, and engagement between the base member 22 and the defining portion 22a is released. When attachment including re-attachment of the solder supply unit 2 to the attachment member 283 is performed, the base member 22 is engaged with the defining portion 22a, and after that, the base member 22 is fixed to the mounting portion 22c. Since the base member 22 can be positioned with the defining portion 22a as a reference, the solder supply unit 2 can be appropriately positioned and attached in a predetermined position.

The attachment member 283 is attached to the moving member 282. The attachment member 283 includes a first engagement member 284 engaged with the first restriction member 30 and a second engagement member 285 engaged with the second restriction member 29. The first engagement member 284 and the second engagement member 285 are provided separated from each other in the feeding direction with the moving member 282 sandwiched therebetween. By moving the attachment member 283 to the attachment position S and engaging the first engagement member 284 with the first restriction member 30, the solder supply unit 2 is positioned in the attachment position S. By moving the attachment member 283 to the detachment position R and engaging the second engagement member 285 with the second restriction member 29, the solder supply unit 2 is positioned in the detachment position R.

The support member 24 is provided on the base member 22 (on the attachment position S side on the base member 22) and supports the guidance member 25. Specifically, the support member 24 extends in an up-down direction and supports the guidance member 25 so that the guidance member 25 is horizontal at a predetermined height position. The support member 24 includes a base attachment part 24L attached to the base member 22 and a guidance attachment part 24U on which the guidance member 25 is supported and attached. The guidance attachment part 24U rollably supports a lower roller 24c. The lower roller 24c is rollable about an axis LRC parallel to a width direction of the lower roller 24c. A lower surface of the tape-like solder material 21 guided by the guidance member 25 to move abuts against the lower roller 24c. In the support member 24 in the present embodiment, two plate-shaped members are disposed at a distance from each other in the width direction, including a first support member 24a disposed on one side and a second support member 24b disposed on the other side. The lower roller 24c is supported by and disposed between a guidance attachment part of the first support member 24a and a guidance attachment part of the second support member 24b. The guidance attachment part 24U is provided with a suppression attachment part (not shown) to which the suppression unit 27 described later is attached.

(Identification Area 26)

As shown in (B) of FIG. 2 and (C) of FIG. 2, the identification area 26 is a portion where the identification part 262 is detected by an identification mechanism 261 (described later) provided on the platform 11. The identification part 262 is, for example, provided on the base member 22 of the solder supply unit 2. The identification part 262 includes an identification attachment part 262a attached to the base member 22 and a plurality of marking portions 262b to be detected by the identification mechanism 261. The plurality of marking portions 262b are formed of a plurality of holes in the present embodiment.

Among the plurality of marking portions 262b, a predetermined marking portion 262b is provided separately according to the type (at least, type of width=width size) of the tape-like solder material 21 held by the reel holder 23. In the example of (C) of FIG. 2, the marking portion 262b is two holes formed side by side in the up-down direction. These holes 262b and 262b are detected by a detection unit 261b (in the present embodiment, two detection units 261b out of three), thereby determining the type of the tape-like solder material 21. In the identification mechanism 261 and the identification part 262 of the identification area 26, the identification mechanism 261 may be configured on the base member 22, and the identification part 262 may be configured on the platform 11.

The identification mechanism 261 is provided on the platform 11 and includes a detection attachment part 261a, a detection unit attachment part 26b, and a plurality of detection units 261b. The detection attachment part 261a is attached to the first restriction member 30 that restricts movement of the solder supply unit 2 to be moved to the attachment position S side. The detection unit 261b detects the plurality of marking portions 262b of the identification part 262. As the detection unit 261b, a photodetection sensor is adopted in the present embodiment. The detection unit 261b is attached to the detection unit attachment part 26b. In the present embodiment, three detection units 261b are disposed and attached at predetermined intervals in the up-down direction.

Since the solder supply unit 2 includes the identification part 262 of the identification area 26, for example, the solder cutting device 3 is able to identify what reel width the reel has, that is, what type (width) of the tape-like solder material 21 is held in the solder supply unit 2.

In this way, when the solder supply unit 2 is removed from the solder piece manufacturing device 12 and a new solder supply unit 2 is attached, it is difficult to determine the type of the tape-like solder material 21 set in the new solder supply unit 2 only by appearance. However, in the solder supply unit 2 in the present embodiment, the type of the tape-like solder material 21 set on the reel can be easily identified by the identification area 26 provided in the solder supply unit 2 itself. Hence, even if an operator sets a wrong reel of the tape-like solder material 21 in the solder supply unit 2 by mistake, since the mistake can be reliably detected, a product defect due to human error can be prevented from occurring.

(Guidance Member 25)

(A) of FIG. 3 is a perspective view showing a shape of a downstream portion of an upper surface of a lower guide member 251 of the guidance member 25, (B) of FIG. 3 is a perspective view showing a shape of an upstream portion of the upper surface of the lower guide member 251 of the guidance member 25, (C) of FIG. 3 is a perspective view showing a shape of a lower surface of the lower guide member 251, and (D) of FIG. 3 is a perspective view showing a state in which the lower surface of the lower guide member 251 is attached to (engaged with) an attachment guide member 39.

The guidance member 25 extends in the feeding direction and guides the tape-like solder material 21 fed out from the above reel. The guidance member 25 may be configured to guide at least the lower surface of the tape-like solder material 21.

As shown in (A) of FIG. 2 and (A) of FIG. 3 to (D) of FIG. 3, the guidance member 25 includes the lower guide member 251 and an upper guide member 252 extending in the feeding direction. The guidance member 25 includes a guidance fixing part 251*a* provided on one end side in the feeding direction and attached to the guidance attachment part 24U of the support member 24, and a tip 251*b* provided on the other end side in the feeding direction and defined in the solder cutting unit 4.

The upper guide member 252 is a plate member configured to be superimposed on the lower guide member 251 from above the lower guide member 251 and having a shape extending in the feeding direction. The upper guide member 252 has the same width as the lower guide member 251 and is disposed on the upper surface of the lower guide member 251 over the feeding direction of the lower guide member 251.

The lower guide member 251 guides the lower surface and a side surface (side part) of the tape-like solder material 21. That is, in the lower guide member 251, a guideway 2511 is formed of the extension portion 2512 extending in the feeding direction (predetermined direction) and guidance side walls 2513 and 2513 guiding the side part of the fed-out tape-like solder material 21. Specifically, in the lower guide member 251, the guidance side walls 2513 and 2513 are formed extending downward from one end of the upper surface of the lower guide member 251 between both ends in a direction orthogonal to the feeding direction and are provided to face each other, and the extension portion 2512 is formed continuous with the other end of each of the guidance side walls 2513 and 2513, thereby forming the guideway 2511. In the lower guide member 251, the height of the guidance side walls 2513 and 2513 and a distance therebetween are set according to the width and thickness that differ depending on the type of the tape-like solder material 21, and the guideway 2511 is formed.

Accordingly, the guidance member 25 restricts downward movement of the fed-out tape-like solder material 21 by the extension portion 2512 of the lower guide member 251. By restricting both side parts of the tape-like solder material 21 by the guidance side walls 2513 and 2513, movement of the fed-out tape-like solder material 21 in the width direction is restricted. Upward movement of the fed-out tape-like solder material 21 is restricted by a lower surface of the upper guide member 252 disposed facing the extension portion 2512. Accordingly, in the guidance member 25, stable guidance can be performed between the guidance fixing part 251*a* and the tip 251*b* in the feeding direction of the tape-like solder material 21.

By adopting the guidance member 25 corresponding to the type of the tape-like solder material 21, the fed-out tape-like solder material 21 can be optimally transferred. That is, in the guidance member 25, the extension portion 2512 and the guidance side wall 2513 form the guideway 2511 of the tape-like solder material 21, the lower surface of the tape-like solder material 21 can be guided by the extension portion 2512, and the side part of the tape-like solder material 21 can be guided by the guidance side wall 2513.

As shown in (B) of FIG. 3, the extension portion 2512 includes a first extension portion 2531 having the guidance side walls 2513 and 2513 provided on both sides thereof, and a second extension portion 2532 provided continuous with the first extension portion 2531 and not having the guidance side walls 2513 and 2513 provided on both sides thereof. The guidance side walls 2513 and 2513 include first guidance side walls 2541 and 2541 provided at an interval allowing both to guide the tape-like solder material 21, and second guidance side walls 2542 and 2542 provided at an interval greater than that of the first guidance side walls 2541. Accordingly, in the solder supply unit 2, the tip of the tape-like solder material 21 can be easily positioned and attached on the guideway 2511 of the guidance member 25.

In the lower guide member 251, when the tip 251*b* is attached to the solder cutting device 3 described later, the tip 251*b* is defined by a guidance defining part 338 provided in the solder cutting device 3. The reason is to guide the tape-like solder material 21 to a cutting position of the solder cutting device 3 where the fed-out tape-like solder material 21 is cut. In detail, in the lower guide member 251, on both side parts of the tip 251*b* in the width direction, inclined parts 251*b*1 and 251*b*1 having a predetermined angle are formed from the tip side in the feeding direction toward each side part of the lower guide member 251. In the lower guide member 251, a certain range of both side parts of the tip 251*b* in the width direction continuous with the inclined parts 251*b*1 and 251*b*1 is set as side tips 251*c*1 and 251*c*1 to be defined by the guidance defining part 338. In the lower guide member 251, a predetermined range in a lower part of the tip 251*b* from the tip side in the feeding direction is set as a lower tip 251*b*2 to be defined by the guidance defining part 338.

As shown in (A) of FIG. 3 to (D) of FIG. 3, the guidance member 25 includes a lower guide 2514 and side guides 2515 and 2515 on a back surface of the lower guide member 251. In the present embodiment, in the lower guide 2514, an upper surface part extending in the width direction is formed. The side guides 2515 and 2515 are respectively provided extending upward from the back surface of the lower guide member 251 at both ends of the lower guide 2514 in the width direction. Accordingly, the side guides 2515 and 2515 are formed in a groove shape extending in the feeding direction and opening on the tip side at the tip 251*b* at one end of the lower guide member 251 in a position on the lower surface of the guidance member 25, that is, the lower guide member 251, on one side in the width direction.

In the case where the solder supply unit 2 is attached to the solder cutting device 3, the lower guide 2514 and the side guides 2515 and 2515 are guided by the attachment guide member 39 included in the solder cutting device 3, and the tip 251b of the lower guide member 251 is positioned and attached in the cutting position of the solder cutting device 3. That is, the lower guide 2514 is provided at a tip (on one side) of the extension portion 2512 in the feeding direction, and during movement to an attachment position where the solder supply unit 2 is attached, the lower guide 2514 is guided by the attachment guide member 39 as downward movement of the extension portion 2512 is defined in a predetermined position. During movement to the attachment position where the solder supply unit 2 is attached, the lower guide 2514 is guided and positioned in the cutting position by the side guides 2515 and 2515 as lateral movement of the extension portion 2512 is defined in a predetermined position.

Accordingly, when the solder supply unit 2 is attached on the upstream side of the solder cutting device 3, by the lower guide 2514 and the side guides 2515 and 2515, the tip 251b of the guidance member 25 is guided to the attachment position set at a predetermined position in the solder cutting device 3. In the attachment position, by defining the tip 251b by the guidance defining part 338 of the solder cutting device 3, the solder cutting device 2 can be efficiently and accurately attached to the solder cutting device 3. Accordingly, the tape-like solder material 21 fed out by the guidance member 25 can be accurately fed out to and set in the cutting position of the solder cutting device 3. Even in the case of the guidance member 25 corresponding to the tape-like solder material 21 of a different type, since the lower guide 2514, the side guides 2515 and 2515 and the tip 251b are provided in common, the tip 251b of the guidance member 25 can be efficiently and accurately attached in the cutting position of the solder cutting device 3.

In the extension portion 2512 of the lower guide member 251 of the guidance member 25, a first opening 2516 as an opening penetrating the extension portion 2512 in the up-down direction is formed. The first opening 2516 includes a first periphery 2551 formed in a predetermined length in an extension direction being the predetermined direction of the extension portion 2512, and a second periphery 2552 formed continuous with the first periphery 2551 and formed in a length shorter than a width of the extension portion 2512. The first opening 2516 is formed in a predetermined width allowing it to receive a first gripper (corresponding to a second holding member 312 among a first holding member 311 and the second holding member 312 shown in FIG. 6) of the solder cutting device 3 moving in the up-down direction. Accordingly, by disposing the tape-like solder material 21 guided by the guidance member 25 between the first holding member 311 and the second holding member 312 of the first gripper in the first opening 2516, and making the first holding member 311 and the second holding member 312 approach and respectively abut against the upper surface and the lower surface of the tape-like solder material 21, it is possible to grip the tape-like solder material 21.

The first opening 2516 is formed in the predetermined length in the feeding direction so that the second holding member 312 is able to move in the feeding direction. Accordingly, it is possible for the first gripper to grip the tape-like solder material 21 in the first opening 2516 and move the tape-like solder material 21 in the feeding direction while gripping it.

In the lower guide member 251 of the guidance member 25, a second opening 2517 is formed in a position (cutting position side) downstream of the first opening 2516 in the feeding direction. The second opening 2517 is formed in a predetermined width allowing it to receive a second gripper (corresponding to a second holding member 352 among a first holding member 351 and the second holding member 352 shown in FIG. 6) of the solder cutting device 3 moving in the up-down direction. Accordingly, by disposing the tape-like solder material 21 guided by the guidance member 25 between the first holding member 351 and the second holding member 352 of the second gripper in the second opening 2517, and making the first holding member 351 and the second holding member 352 approach and respectively abut against the upper surface and the lower surface of the tape-like solder material 21, it is possible to grip the tape-like solder material 21. During cutting of the tape-like solder material 21 in the solder cutting device 3, the second gripper is able to grip the tape-like solder material 21 in the second opening 2517, and the solder cutting device 3 is able to stably cut the tape-like solder material 21. By the second gripper gripping the tape-like solder material 21, the grip of the tape-like solder material 21 by the first gripper can be released, and preparation can be made for a next feeding operation of the tape-like solder material 21.

As shown in (A) of FIG. 2, in the upper guide member 252 of the guidance member 25, an opening 2521 of a predetermined length and width is formed in the feeding direction in a state in which the tip 251b side in the feeding direction is open. Specifically, in the opening 2521, an opening continuous from the tip 251b in the feeding direction toward the guidance fixing part 251a is formed up to a position matching a position of an end on the guidance fixing part 251a side of the first opening 2516 in the up-down direction. By forming the opening 2521 in this way, an open space is formed in which the opening 2521 communicates with the first opening 2516 and the second opening 2517 in the up-down direction.

On the lower surface of the lower guide member 251 of the guidance member 25, a recess 2518 (see (C) of FIG. 3) formed in a predetermined length and width in the feeding direction and at a predetermined height from the lower surface of the lower guide member 251 is formed from the tip 251b side in the feeding direction toward the guidance fixing part 251a while the tip 251b side is open. Specifically, the recess 2518 is formed from the tip 251b in the feeding direction up to a position matching the position of the end on the guidance fixing part 251a side of the first opening 2516. That is, the recess 2518 is formed in an area from a front end of the first opening 2516 on the lower surface of the guidance member 25 to the tip of the guidance member 25. A bottom surface of the guideway 2511 and a bottom surface of the recess 2518 are formed in which the bottom surfaces are adjacent to each other with a second thickness dimension smaller than a first thickness dimension being a dimension between the upper surface and the lower surface of the lower guide member 251. Accordingly, an operation distance between a gripping state position and a grip release position of the first and second grippers can be set as a distance greater than the second thickness dimension and smaller than the first thickness dimension. In the guidance member 25, since the recess 2518 is formed on the lower surface within the width of the lower guide member 251 within the dimension of the guidance member 25 in the width direction, occupied area in the width direction can be effectively utilized.

(Suppression Unit 27)

The suppression unit 27 is provided above the guidance member 25 and is configured to be movable between a standby position when the tape-like solder material 21 is to be attached to the guidance member 25 and the attachment position when the tape-like solder material 21 is attached to the guidance member 25. The suppression unit 27 energizes the upper surface of the tape-like solder material 21 located on the guideway 2511 toward the extension portion 2512. Specifically, the suppression unit 27 includes a suppression mechanism 271 suppressing upward movement of the tape-like solder material 21 guided by the guidance member 25, and a suppression support 272 supporting the suppression mechanism 271. The suppression mechanism 271 includes a suppression member (suppression roller) 271b abutting against the upper surface of the tape-like solder material 21, and a suppression moving body 271a supporting and moving the suppression member 271b. The suppression member 271b is provided at a moving end of the suppression moving body 271a and is configured to be rollable about a rotation axis URC set parallel to the width direction. The suppression support 272 includes a suppression moving support 272b movably supporting the suppression moving body 271a, and a movement support attachment part 272a attaching the suppression moving support 272b to the support member 24 so that the suppression moving support 272b is capable of supporting in a position away from the guidance member 25. The suppression moving body 271a is axially supported by the suppression moving support 272b so as to be rotatable about an axis HC extending in a direction parallel to the width direction of the tape-like solder material 21 fed out from the reel. Accordingly, the solder supply unit 2 is able to stably guide the tape-like solder material 21 fed out from the reel by the guidance member 25 and the suppression unit 27.

(Advantages of Solder Supply Unit 2)

In the solder supply unit 2, since the guidance member 25 is provided on the support member 24, and the reel holder 23 and the support member 24 are provided on the base member 22 and are integrally configured, for example, in the case of replacing the solder supply unit 2 attached to the solder cutting device 3, the solder supply unit 2 can be attached and detached by attachment and removal of the base member 22.

(Solder Cutting Device 3)

FIG. 4 is a perspective view of the solder cutting device 3 shown in FIG. 1. FIG. 5 is a front view of the solder cutting device 3 shown in FIG. 4.

As shown in FIG. 4 and FIG. 5, the solder cutting device 3 includes a first holding part 31, a first drive part 32, a cutting part 33, a second drive part 34, a second holding part 35, a cleaning unit 36, a cut solder transfer part 37, and a frame 38. The solder cutting device 3 includes the movement mechanism 28 movably supporting the solder supply unit 2 between the attachment position S and the detachment position R. The solder cutting device 3 includes the identification mechanism 261 identifying the type of the tape-like solder material 21 to be supplied.

(Frame 38)

The frame 38 is provided on the platform 11 and includes a lower base portion 381 and an upper base portion 382. The lower base portion 381 is a plate-shaped member having a predetermined width and having a predetermined length extending in a sending direction (feeding direction) of the tape-like solder material 21. The upper base portion 382 is a plate-shaped member located above the lower base portion 381, having substantially the same width as the lower base portion 381, and having a predetermined length extending in the sending direction in parallel with the lower base portion 381. The upper base portion 382 is a plate-shaped member of a shorter length than the lower base portion 381. The upper base portion 382 is connected to a connection portion 383 supported by the lower base portion 381 at a downstream end (one end). The upper base portion 382 is connected to an auxiliary connection portion 383a supported by the lower base portion 381 upstream of the downstream end. In other words, the lower base portion 381 and the upper base portion 382 are connected by the connection portion 383 connected to each other on one side in the first direction (X direction, feeding direction) and the auxiliary connection portion 383a connected to each other on the other side in the first direction, and the frame 38 is integrally formed.

(First Holding Part 31)

(A) of FIG. 6 is an enlarged perspective view showing the first holding part 31 shown in FIG. 4 and FIG. 5, and (B) of FIG. 6 is an enlarged perspective view showing the second holding part 35 shown in FIG. 4 and FIG. 5. As shown in FIG. 5 and (A) of FIG. 6, the first holding part 31 holds and releases the tape-like solder material 21 supplied from the solder supply unit 2. As shown in (A) of FIG. 6, the first holding part 31 includes the first holding member 311 and the second holding member 312 as well as a first holding drive part 313. The first holding part 31 includes a first holding mounting part 31a supporting the first holding member 311 and the second holding member 312 as well as the first holding drive part 313.

The first holding member 311 and the second holding member 312 face each other and are provided so as to approach and separate from each other. In the present embodiment, the first holding member 311 and the second holding member 312 are provided so as to approach and separate from each other in the up-down direction. The first holding drive part 313 actuates the first holding member 311 and the second holding member 312 in a second direction (Z direction: up-down direction) perpendicular to a plane part of the tape-like solder material 21. Each tip of the first holding member 311 and the second holding member 312 is formed in a plane shape, formed and disposed so that respective faces are able to abut against each other. Each tip of the first holding member 311 and the second holding member 312 is disposed so as to be in a central part of the guidance member 25 in the width direction.

The first holding drive part 313 includes a third actuator 3131 being a drive source of the first holding member 311 and the second holding member 312, and a transmission mechanism 3133 transmitting driving force to the first holding member 311 and the second holding member 312. The third actuator 3131 includes a holding moving body 3132 movable in the first direction (X direction), and the holding moving body 3132 is reciprocated linearly between a holding operation position set on one side in the first direction and a holding release position set on the other side in the first direction. The third actuator 3131 is supported by a support 31b supported by the first holding mounting part 31a. The holding moving body 3132 is movably supported by a support 31c supported by the first holding mounting part 31a. In the present embodiment, the holding moving body 3132 is a member having a triangular shape in a side view, disposed so that a first surface 313a faces upward, disposed so that a second surface 313b faces downward, and disposed in an inclined manner so that a distance between the first surface 313*a* and the second surface 313*b* gradually decreases toward the first direction.

The transmission mechanism 3133 converts a linear motion of the holding moving body 3132 in the first direction into a linear motion in the second direction (Z direction), and transmits driving force for moving the first holding member 311 and the second holding member 312 in the second direction.

In the present embodiment, the transmission mechanism 3133 actuates the first holding member 311 and the second holding member 312. Specifically, the transmission mechanism 3133 includes an upper chuck mechanism 3134, an upper follower part 3135, an upper elastic member (spring member) 3138, a lower chuck mechanism 3136, a lower follower part 3137 and a lower elastic mechanism (spring member) 3139.

The upper chuck mechanism 3134 includes the first holding member 311 and the upper elastic member 3138, and the upper follower part 3135 is connected to the first holding member 311. The upper chuck mechanism 3134 includes an upper support 311*a* supported by the first holding mounting part 31*a*, and an upper moving body (not shown) to which the first holding member 311 is connected, the upper moving body being provided on the upper support 311*a* so as to be movable in the up-down direction. The upper elastic member 3138 has one side connected to the first holding member 311 and the other side connected to the upper support 311*a*, thereby imparting downward elastic force (movement force). Since the upper follower part 3135 is maintained in a state of abutting against the first surface 313*a* of the holding moving body 3132 by elastic force of the upper elastic member 3138, the upper chuck mechanism 3134 is able to reciprocate in the second direction as the holding moving body 3132 moves in the first direction.

The lower chuck mechanism 3136 includes the second holding member 312 and the lower elastic member 3139, and the lower follower part 3137 is connected to the second holding member 312. The lower chuck mechanism 3136 includes a lower support 312*a* supported by the first holding mounting part 31*a*, and a lower moving body (not shown) to which the second holding member 312 is connected, the lower moving body being provided on the lower support 312*a* so as to be movable in the up-down direction. The lower elastic member 3139 has one side connected to the second holding member 312 and the other side connected to the lower support 312*a*, thereby imparting upward elastic force (movement force). Since the lower follower part 3137 is maintained in a state of abutting against the second surface 313*b* of the holding moving body 3132 by elastic force of the lower elastic member 3139, the lower chuck mechanism 3136 is able to reciprocate in the second direction as the holding moving body 3132 moves in the first direction.

In the upper chuck mechanism 3134, when the holding moving body 3132 advances, the first holding member 311 is raised from a holding position of the tape-like solder material 21 set in the second direction to an upper holding release position: when the holding moving body 3132 retreats, the first holding member 311 is lowered from the upper holding release position of the tape-like solder material 21 set in the second direction to the holding position. Similarly, in the lower chuck mechanism 3136, when the holding moving body 3132 advances, the second holding member 312 is lowered from the holding position of the tape-like solder material 21 set in the second direction to the lower holding release position; when the holding moving body 3132 retreats, the second holding member 312 is raised from the lower holding release position of the tape-like solder material 21 set in the second direction to the holding position. Accordingly, it is possible to hold and release the tape-like solder material 21 by the first holding member 311 and the second holding member 312. The first holding part 31 may be configured so that the tape-like solder material 21 can be held and released by only the second holding member 312 on the lower side, for example, by the second holding member 312 adhering to and releasing the lower surface of the tape-like solder material 21. An adhesion member may be adopted so that an adhesion mark is not left when holding is performed by adhesion.

(First Drive Part 32)

The first drive part 32 includes a first holding moving body 32*b* disposed on one side of the upper base portion 382 in the first direction and equipped with the first holding part 31, and a first drive mechanism 32*a* causing the first holding moving body 32*b* to be sent linearly in the feeding direction (first direction (X direction)) of the tape-like solder material 21. The first holding moving body 32*b* is a plate-shaped member having a predetermined width and having a predetermined length in the first direction. By mounting and fixing the first holding mounting part 31*a* on an upper portion of the first holding moving body 32*b*, the first holding part 31 is moved in the first direction together with the first holding moving body 32*b*. The first drive mechanism 32*a* includes a shaft 32*a*1 whose axis extends in the first direction, and the first drive mechanism 32*a* is a first actuator that is electrically-driven and moves the shaft 32*a*1 in the first direction by converting a rotational motion of a built-in rotating body (not shown) into a linear motion in the first direction. The first actuator is mounted on the upper base portion 382 and includes a movement position detection means (for example, an encoder)(not shown), and is able to move the shaft 32*a*1 to any position in the first direction by setting a movement position in the first direction according to numerical data and operating according to numerical control. The first drive part 32 is configured to be able to reciprocate the first holding moving body 32*b* in the first direction by connecting one end of the shaft 32*a*1 to the first holding moving body 32*b*.

By configuring the first holding part 31 on the first drive part 32 in this way, the tape-like solder material 21 held by the first holding part 31 can be transferred in the feeding direction. A transfer distance of the tape-like solder material 21 to be transferred in the feeding direction can be arbitrarily set by controlling movement of the shaft 32*a*1 of the first actuator with numerical data.

(Cutting Part 33)

(A) of FIG. 7 is a perspective view of a cutter unit 333 provided in the cutting part 33, (B) of FIG. 7 is a perspective view of a state in which a support member 334 supporting the cutter unit 333 and a connection member 3423 have been removed, (C) of FIG. 7 is a perspective view of a state in which a guide support member 335 has been removed, (D) of FIG. 7 is a longitudinal sectional view of the cutting part 33 and the vicinity of the cutting part 33, (E) of FIG. 7 is a front view of the cutting part 33. (F) of FIG. 7 is a perspective view showing a positional relationship between the cutting part 33 and a cut piece holding part 371, and (G) of FIG. 7 is a perspective view showing a positional relationship between the cutting part 33 and the guidance member 25.

As shown in (A) of FIG. 7 to (G) of FIG. 7, the cutting part 33 includes the cutter unit 333, the support member 334, and the connection member 3423. The connection member 3423 is connected to a moving member 3331 (described later) of the cutter unit 333 and is supported by the support member 334 so as to be movable in the second direction. The support member 334 defines a position of the cutter unit 333 in the second direction. That is, the support member 334 disposes the cutter unit 333 above an upper base portion 332, and supports the cutter unit 333 so that the tape-like solder material 21 can be cut by the cutter unit 333 in a position above the upper base portion 332.

As shown in (E) of FIG. 7, the cutting part 33 includes a first cutting member 331 and a second cutting member 332 facing each other and provided so as to approach and separate from each other, and cuts the tape-like solder material 21 located in a cutting position between the first cutting member 331 and the second cutting member 332. In the present embodiment, the first cutting member 331 is configured to be movable in the second direction (Z direction) perpendicular to the plane part of the tape-like solder material 21. That is, the first cutting member 331 that is capable of moving up and down includes an upper blade part 331a, and the second cutting member 332 includes a lower blade part 332a provided in a fixed state at the cutting position. The cutting of the tape-like solder material 21 by the cutter unit 333 is performed by lowering the first cutting member 331 to a position indicated by broken lines and intersecting the upper blade part 331a with the lower blade part 332a.

A width of the upper blade part 331a and the lower blade part 332a is formed greater than a width of the tape-like solder material 21 to be supplied, and is set to be commonly applicable to cutting of the tape-like solder material 21 of a plurality of width sizes including the tape-like solder material 21 of a maximum width to be supplied. For example, in the present embodiment, the maximum width of the tape-like solder material 21 to be supplied is 50 mm or less, and it is set that a plurality of tape-like solder materials 21 formed in a width smaller than the maximum width can be cut in common.

The cutter unit 333 includes: the moving member 3331 in which the first cutting member 331 is configured; a pair of guide support members 335, attached to and supported by the connection portion 383 supported by the lower base portion 381, disposed spaced apart by a predetermined distance in an upper portion of the support member 334, and guiding movement of the moving member 3331; a one side holding member 336, provided in the first direction of the moving member 3331 and restricting movement of the moving member 3331 toward one side in the first direction; and an other side holding member 337, restricting movement of the moving member 3331 toward the other side in the first direction.

The moving member 3331 includes in an upper part an upper attachment part 3331a in which the first cutting member 331 is configured and in a lower part a lower connection portion 3331b connected to the connection member 3423 described later, and includes between the upper attachment part 3331a and the lower connection portion 3331b an opening 3332 in which an opening allowing for arrangement of the tape-like solder material 21 is formed. The opening of the opening 3332 is formed in a size allowing the moving member 3331 to move between the standby position and the cutting position when the tape-like solder material 21 supported by the cut piece holding part 371 of the cut solder transfer part 37 described later is to be cut while allowing the cut piece holding part 371 to enter and exit a cutting support position (position adjacent to the second cutting member 332).

The pair of guide support members 335 are respectively disposed in the width direction of the moving member 3331 and include a guide 335a guiding movement of the moving member 3331 in the second direction (up-down direction) while restricting movement thereof in the width direction, and a cutting support 335b to which the second cutting member 332 is attached. The one side holding member 336 is attached to one side of the pair of guide support members 335 in the first direction, and the other side holding member 337 is attached to the other side of the pair of guide support members 335 in the first direction, above the second cutting member 332.

The one side holding member 336 has, for example, a square frame shape and includes an opening 3371 larger than the opening 3332 of the moving member 3331 in a position corresponding to the opening 3332. The other side holding member 337 is provided between the moving member 3331 and a portion of the guidance defining part 338 opposite to the first direction and restricts movement of the moving member 3331 toward the other side in the first direction. As shown in (G) of FIG. 7, the guidance defining part 338 has a first portion 338d disposed on an upper surface of the other side holding member 337 and a second portion 338e disposed on an upstream surface among side surfaces of the other side holding member 337. The second portion 338e includes an opening 338c having a shape obtained by cutout in a substantially rectangular shape upward from a lower end of the second portion 338e. The guidance member 25 is inserted into the opening 338c, and left and right side parts of the opening 338c are guide defining portions 338a and 338a defining a position of a side part of the guidance member 25. At left and right lower ends of the opening 338c, guidance lower defining portions 338b and 338b are formed protruding in a direction of the guide defining portion 338a on the respective opposite sides and defining a position of a lower part of the guidance member 25.

(Second Drive Part 34)

The second drive part 34 actuates the first cutting member 331 in the second direction (Z direction) perpendicular to the plane part of the tape-like solder material 21. The plane part is the upper surface or the lower surface of the tape-like solder material 21. In the present embodiment, the second drive part 34 actuates the first cutting member 331 between a cutting standby position provided above the upper surface of the tape-like solder material 21 and a cutting completion position provided below the upper surface of the tape-like solder material 21. The second drive part 34 is disposed on one side of the lower base portion 381 in the first direction, and includes a second moving body 34a moving in the first direction, and a second actuator 341. The second drive part 34 includes a transmission mechanism 342 transmitting an operation of the second actuator 341 to a cutting operation of the first cutting member 331.

The second actuator 341 is mounted on the lower base portion 381 and linearly moves a transmission moving body 343 movable in the feeding direction (first direction (X direction)). The transmission mechanism 342 converts the linear motion of the transmission moving body 343 into a linear motion in the second direction (Z direction) perpendicular to the plane part of the tape-like solder material 21, and transmits the above linear motion to the upper blade 331.

As shown in FIG. 5, the transmission mechanism 342 is a plane cam mechanism and includes a plane cam 3421, a cam follower 3422, and the connection member 3423. The transmission moving body 343 is mounted on a moving body mounting member 343a and driven by the second actuator 341 to move to one side in the first direction. The moving body mounting member 343a is provided on a mounting member support 343b. The plane cam 3421 is configured in a downstream portion of the transmission moving body 343. In the present embodiment, a cam surface 3421*a* is in a state inclined diagonally upward from a downstream portion toward an upstream portion.

The cam follower 3422 abuts against the cam surface 3421*a* of the plane cam 3421, and moves in the second direction due to movement of the transmission moving body 343, that is, the cam surface 3421*a*, toward one side in the first direction. The cam follower 3422 is supported by the connection member 3423, and the connection member 3423 is connected to the moving member 3331 and the first cutting member 331 as described above. In the present embodiment, the cam follower 3422 is pushed down by the cam surface 3421*a* of the plane cam 3421 as the transmission moving body 343 moves toward the downstream side in the first direction. Accordingly, the connection member 3423, the moving member 3331 and the first cutting member 331 of the cutting part 33 move downward, and the tape-like solder material 21 can be cut by the upper blade part 331*a* of the first cutting member 331 and the lower blade part 332*a* of the second cutting member 332.

The transmission mechanism 342 of the second drive part 34 includes an energization mechanism 3424 energizing the connection member 3423 upward. The energization mechanism 3424 includes: a moving end 3424*a*, connected to the connection member 3423 and moving as the connection member 3423 moves; a fixed end 3424*b*, fixed to the lower base portion 381; and an energization member 3424*c* (for example, a spring member as an elastic member), disposed between the moving end 3424*a* and the fixed end 3424*b* and imparting upward movement force to the moving end 3424*a*.

The first cutting member 331 that has moved downward is imparted with upward movement force from the energization mechanism 3424 due to movement of the transmission moving body 343 toward the other side in the first direction by an operation of the second actuator 341, and starts an upward movement. In detail, the cam follower 3422 configured on the connection member 3423 abuts against the plane cam 3421 by upward energization force from the energization mechanism 3424, and its upward movement is restricted. By moving the transmission moving body 343 toward the other side in the first direction, the restriction on upward movement imposed by the plane cam 3421 is gradually removed. The first cutting member 331 is gradually moved upward by gradually removing the restriction on upward movement imposed by the plane cam 3421, and the upper blade part 331*a* configured in the first cutting member 331 will be moved upward as the first cutting member 331 moves upward.

(Second Holding Part 35)

As shown in FIG. 5 and (B) of FIG. 6, the second holding part 35 is provided between the first holding part 31 and the cutting part 33 in the first direction, and holds and releases the tape-like solder material 21 to be cut. The second holding part 35 includes the first holding member 351 and the second holding member 352 as well as a second holding drive part 353. The second holding part 35 includes a support 35*a* spaced by a predetermined distance from the support member 334 and connected to and supported by the upper base portion 382, and a mounting part 35*b* disposed above and spaced by a predetermined distance from the upper base portion 382 and supported by the support member 334 and the support 35*a*. The first holding member 351 and the second holding member 352 as well as the second holding drive part 353 are supported by the mounting part 35*b*.

The first holding member 351 and the second holding member 352 face each other and are provided so as to approach and separate from each other. The second holding drive part 353 actuates at least one of the first holding member 351 and the second holding member 352 in the second direction (Z direction) perpendicular to the plane part of the tape-like solder material 21. Each tip of the first holding member 351 and the second holding member 352 is formed in a plane shape, formed and disposed so that their respective faces are able to abut against each other. Each tip of the first holding member 351 and the second holding member 352 is disposed so as to be in a central part of the guidance member 25 in the width direction.

The second holding drive part 353 includes a fourth actuator 3531 and a transmission mechanism 3533. The fourth actuator 3531 includes an actuator operation part 3532 configured on the mounting part 35*b* and movable in the second direction (Z direction). The actuator operation part 3532 is disposed on the mounting part 35*b* so as to pass through an opening formed in the mounting part 35*b*, and the actuator operation part 3532 is linearly moved in the up-down direction.

In the present embodiment, the transmission mechanism 3533 actuates the first holding member 351 and the second holding member 352. Specifically, the transmission mechanism 3533 includes an upper chuck mechanism 3534, an upper elastic member (spring member) 351*a*, an upper follower part 3535, a lower chuck mechanism 3536, a lower elastic mechanism (spring member) 352*a* and a lower follower part 3137. The transmission mechanism 3533 includes an intermediate transmission mechanism (balance mechanism) 3538 supported by the mounting part 35*b* and transmitting the linear motion of the actuator operation part 3532 to the first holding member 351.

The upper chuck mechanism 3534 includes the first holding member 351 and the upper elastic member (spring member) 351*a*, and the upper follower part 3535 is connected to the first holding member 351. The upper chuck mechanism 3534 includes: an upper support 351*b*, supported by the mounting part 35*b*; an upper moving body (not shown), to which the first holding member 351 is connected, provided on the upper support 351*b* so as to be movable in the up-down direction; and a contact part (not shown) included in the upper support 351*b*. The upper elastic member 351*a* has one side connected to the first holding member 351 and the other side connected to the upper support 351*b*, thereby imparting downward elastic force (movement force). The upper follower part 3535 is engaged with an intermediate transmission member 3538*b* of the intermediate transmission mechanism 3538 described later.

When the actuator operation part 3532 advances, the upper chuck mechanism 3534 rises; when the actuator operation part 3532 retreats, the upper chuck mechanism 3534 lowers. Specifically, since the actuator operation part 3532 abuts against the contact part (not shown) and moves upward, the first holding member 351 is moved upward, and the upper follower part 3535 is also moved upward. Thereby, the upper chuck mechanism 3534 abuts against an engagement part of the intermediate transmission mechanism 3538. When the actuator operation part 3532 retreats, the first holding member 351 is moved downward by being imparted with downward elastic force (movement force) of the upper elastic member (spring member) 351*a*, and the upper follower part 3535 is also moved downward. Thereby, the upper chuck mechanism 3534 is separated from the engagement part of the intermediate transmission mechanism 3538.

The intermediate transmission mechanism 3538 includes an intermediate support 3538a supported by the mounting part 35b and the intermediate transmission member 3538b swingably supported by the intermediate support 3538a. The intermediate transmission mechanism 3538 includes a swing restriction mechanism 3538c restricting a swinging operation in one direction of the intermediate transmission member 3538b. The intermediate support 3538a has one side supported by the mounting part 35b, and swingably supports the intermediate transmission member 3538b at the other end. The intermediate transmission member 3538b is a rectangular member, and is axially supported by the intermediate support 3538a so as to be swingable about an axis whose central part is provided parallel to the first direction. In short, the intermediate transmission mechanism 3538 is configured as a balance mechanism swingably supporting the intermediate transmission member 3538b. The swing restriction mechanism 3538c is supported by the mounting part 35b and restricts upward swinging movement of the other end of the intermediate transmission member 3538b.

The lower chuck mechanism 3536 includes the second holding member 352 and the lower elastic member 352a, and the lower follower part 3537 is connected to the second holding member 352. The lower chuck mechanism 3536 includes a lower support 352b supported by the mounting part 35b, and a lower moving body (not shown) to which the second holding member 352 is connected, the lower moving body being provided on the lower support 352b so as to be movable in the up-down direction. The lower elastic member 352a has one side connected to the second holding member 352 and the other side connected to the lower support 352b, thereby imparting upward elastic force (movement force). Since the lower follower part 3537 is maintained in a state of being moved to abut against the other end of the intermediate transmission member 3538b by elastic force of the lower elastic member 352a, the lower chuck mechanism 3536 is able to reciprocate in the up-down direction as the other end of the intermediate transmission member 3538b swings.

In the second holding part 35, the actuator operation part 3532 abuts against the contact part of the upper chuck mechanism 3534 by advancing (moving) upward, and, by further raising the actuator operation part 3532, the upper chuck mechanism 3534 is moved upward against downward movement force of the upper elastic member (spring member) 351a. Then, the upper follower part 3535 is raised as the first holding member 351 is moved upward, and abuts against one end of the intermediate transmission member 3538b to move one end of the intermediate transmission member 3538b upward. By moving one end of the intermediate transmission member 3538b upward, the other end of the intermediate transmission member 3538b is lowered against upward movement force of the lower elastic member (spring member) 352a. By lowering the lower follower part 3537 that abuts against the other end, the lower chuck mechanism 3536 is lowered and the second holding member 352 is lowered.

In the second holding part 35, since the actuator operation part 3532 advances (moves) downward, downward movement force of the upper elastic member (spring member) 351a is transmitted to the upper chuck mechanism 3534. By further movement of the actuator operation part 3532 in a direction away from the contact part of the upper chuck mechanism 3534, the upper chuck mechanism 3534 is moved downward. Then, the upper follower part 3535 is lowered as the first holding member 351 is moved downward, and, by releasing the contact with one end of the intermediate transmission member 3538b, upward movement of one end of the intermediate transmission member 3538b is canceled. By cancelation of the upward movement of one end of the intermediate transmission member 3538b, the lower chuck mechanism 3536 is imparted with upward movement force of the lower elastic member (spring member) 352a. As the second holding member 352 is raised, the lower follower part 3537 is raised, thereby abutting against the other end of the intermediate transmission member 3538b and raising the other end. The other end of the intermediate transmission member 3538b that is moved upward by rising of the lower chuck mechanism 3536 is restricted from moving upward by the swing restriction mechanism 3538c.

Accordingly, it is possible to hold and release the tape-like solder material 21 by the first holding member 351 and the second holding member 352. By releasing the holding of the tape-like solder material 21 by the first holding part 31 after the second holding part 35 has held the tape-like solder material 21, preparation can be made for a next feeding operation of the tape-like solder material 21 by the first holding part 31. Accordingly, the first holding part 31 for the next cutting can be efficiently prepared.

The second holding part 35 may be configured so that the tape-like solder material 21 can be held and released by only the second holding member 352 on the lower side, for example, by the second holding member 352 adhering to and releasing the lower surface of the tape-like solder material 21. A holding member may be adopted so that an adhesion mark is not left when holding is performed by adhesion.

(Cleaning Unit 36)

The cleaning unit 36 is provided in a position on the downstream side of the cutting part 33 on the frame 38. The cleaning unit 36 cleans the cam surface 3421a of the plane cam 3421 and the cam follower 3422, for example, by air blow. Specifically, the cleaning unit 36 includes a nozzle 361 disposed toward the cam surface 3421a of the plane cam 3421 and the cam follower 3422, and blows out supplied compressed air from the nozzle 361. The cleaning unit 36 may be configured to clean at least one of the cam surface 3421a of the plane cam 3421 and the cam follower 3422. Accordingly, at least one of the cam surface 3421a of the plane cam 3421 and the cam follower 3422 can be kept clean, and a malfunction (for example, vibration) of the transmission mechanism 342 can be prevented.

(Cut Solder Transfer Part 37)

FIG. 8 is an enlarged perspective view showing the cut solder transfer part 37 shown in FIG. 4 and FIG. 5. As shown in FIG. 8, the cut solder transfer part 37 includes the cut piece holding part 371 and a cut piece holding drive part 372. The cut piece holding part 371 receives and holds in the cutting support position a solder piece obtained by cutting by the cutting part 33 from the tape-like solder material 21. The cut piece holding drive part 372 moves the cut piece holding part 371 between the cutting support position and the takeout position separated from the cutting support position, the takeout position being where the solder piece is taken out.

The cut piece holding drive part 372 is provided on the lower base portion 381, and includes a support member 37a, an actuator mounting table 372c, a fifth actuator 372a, a moving part 372b, and a support 371a. The support member 37a is provided on the lower base portion 381 and supports the actuator mounting table 372c. The actuator mounting table 372c has the fifth actuator 372a mounted thereon. The fifth actuator 372a reciprocates the moving part 372b in the first direction. The support 371a is provided on a restriction part 371c and supports, while allowing up-down movement of, a moving body 371b, that is, the cut piece holding part 371. Accordingly, it is possible that the cut piece holding part 371 is driven by the fifth actuator 372a to reciprocate between the takeout position and the cutting support position in the first direction.

The cut piece holding drive part 372 includes a height adjustment part 373a adjusting a height position of the cut piece holding part 371. The height adjustment part 373a includes an elastic member 371d imparting upward movement force of the moving body 371b, and a height adjustment screw 373 restricting upward movement of the moving body 371b and adjusting the height. The elastic member 371d is disposed between the moving body 371b and the restriction part 371c. The height adjustment screw 373 is fixed to the restriction part 371c and adjusts upward movement of the cut piece holding drive part 372 by a screw mechanism, thereby adjusting the height position at which the lower surface of the tape-like solder material 21 in the cutting position is supported.

In the above movement of the cut piece holding part 371 by the fifth actuator 372a, the cut piece holding part 371 is provided so as to be able to pass through the opening 3332 in the moving member 3331 of the cutter unit 333, and is adjacent to the second cutting member 332 in the cutting position set in the cutter unit 333. In the cut piece holding part 371, the height of a support surface supporting the tape-like solder material 21 is adjusted by the height adjustment part (screw mechanism) 373a so as to be at the same height position as a support surface of the second cutting member 332 supporting the lower surface of the tape-like solder material 21 before cutting. Accordingly, the cut solder transfer part 37 is able to transfer the solder piece from the cutting support position to the takeout position by the cut piece holding part 371.

(Advantages of Solder Cutting Device 3)

In the solder cutting device 3, an axis direction of a drive shaft or a forward/backward direction of a drive part is configured toward the first direction or the second direction rather than the width direction of the tape-like solder material 21, in other words, the direction orthogonal to the first direction and the second direction. That is, in the solder cutting device 3, the axis of the drive shaft does not face the width direction of the tape-like solder material 21, or the drive part does not move forward or backward in the width direction of the tape-like solder material 21. Thus, in the solder cutting device 3, it is possible to significantly reduce a device size (dimension) in the width direction of the tape-like solder material 21 as compared with the conventional device described in Patent Document 1 and the like. For example, when the conventional device has a device width of 200 mm, the device width of the solder cutting device 3 at the same scale is 50 mm or less, and the device width is actually ¼ or less. Such an effect is realized in particular by the first drive part 32 being the first actuator, and the second drive part 34 including the holding moving body 3132, the second actuator 341 and the transmission mechanism 342. Since the solder cutting device 3 has a significantly small device width per unit, for example, in a system in which a plurality of solder cutting devices 3 are installed side by side in the width direction and a solder piece supplied from each solder cutting device 3 is used, the effect of suppressing the device width is enhanced in proportion to the number of the solder cutting devices 3 installed. As a result, since a footprint of this system becomes smaller, the system can be reduced in size.

(Solder Cutting Unit 4)

As shown in FIG. 4 and FIG. 5, the solder cutting unit 4 includes the frame 38, and the frame 38 is equipped with the first holding part 31, the first drive part 32, the cutting part 33, the second drive part 34 and the second holding part 35 in the solder cutting device 3. Specifically, on the frame 38, the upper base portion 382 provided with the first drive part 32, the support member 334 provided with the cutting part 33, the lower base portion 381 provided with the second drive part 34 and the mounting part 35b provided with the second holding part 35 are provided. The first holding part 31 is mounted on the first drive part 32.

In a first layer being a lowermost layer of the frame 38, that is, between the lower base portion 381 and the upper base portion 382, the second actuator 341 as well as the plane cam 3421, the cam follower 3422 and a lower part of the connection member 3423 of the transmission mechanism 342 are provided. Specifically, the tape-like solder material 21 is guided by the guidance member 25 disposed above the first layer and sent above the first layer. Between the tape-like solder material 21 sent in this way and the first layer, the first holding part 31, the first drive part 32, the cutting part 33 and the second drive part 34 are provided.

In detail, the first holding member 311 of the first holding part 31 and the first holding member 351 of the second holding part 35 are located above the tape-like solder material 21. Similarly, the upper blade (first cutting member) 331 of the cutting part 33 is located above the tape-like solder material 21.

According to the above configuration, in the part mounting device 5 including a transfer unit 54, even if a plurality of solder cutting devices 3 are provided side by side in the width direction, as described above, since the plurality of solder cutting devices 3 have a small device width overall, a movable width (movement distance) of the transfer unit 54 may also be small. This means that work time required for transferring a solder piece in the part mounting device 5 is shortened. That is, in the part mounting device 5, it is possible to transfer a solder piece in a short cycle time, and high-speed processing is possible. Since the solder cutting unit 4 can be replaced together with the frame 38, replacement work is easy and positioning reproducibility at the time of re-installation is good.

As shown in FIG. 5, in the solder cutting unit 4, the second actuator 341 and the transmission mechanism 342 are provided on the lower base portion 381 in the first layer, and the tape-like solder material 21 is guided by the guidance member 25 disposed above the first layer and is sent above the first layer. The upper base portion 382 is provided between the tape-like solder material 21 to be sent and the first layer, and the upper base portion 382 is provided with the first drive part 32 (first actuator) and the second holding part 35.

The upper base portion 382 and the lower base portion 381 of the frame 38 include the connection portion 383 connected to each other on one side in the feeding direction (first direction). The first drive part 32 (first actuator) is provided on the other side of the upper base portion 382 away from the connection portion 383, and the second actuator 341 is provided on the other side of the lower base portion 381 away from the connection portion 383. According to the above configuration, removal work when the first drive part 32 (first actuator) and the second drive part 34 (second actuator 341) are removed from the frame 38 from one of a plurality of solder cutting units 4 disposed side by side, in particular, is easy. During this removal work, the solder supply unit 2 is removed from the solder cutting unit 4 prior to removal of the first drive part 32 and the second drive part 34.

As shown in FIG. 5, in the solder cutting unit 4, the first holding part 31, the first drive part 32, the cutting part 33, the second drive part 34, the second holding part 35 and the cut solder transfer part 37 are provided on the frame 38. On the frame 28, a solder transfer support provided with the cut solder transfer part 37 is provided. The first holding part 31, the first drive part 32, the cutting part 33, the second drive part 34 and the second holding part 35 are provided on a supply processing side where the tape-like solder material 21 is supplied based on the connection portion 383, and the cut solder transfer part 37 is provided on a takeout side where a solder piece obtained by cutting is taken out based on the connection portion 383. Accordingly, since the solder cutting unit 4 can be replaced together with the frame 38 including the cut solder transfer part 37, replacement work is easy. During this replacement work, the solder supply unit 2 is removed from the solder cutting unit 4 prior to replacement of the solder cutting unit 4.

(Operation of First Holding Part 31, First Drive Part 32 and Cutting Part 33)

FIG. 9 is an explanatory view of an operation from feeding of the tape-like solder material 21 by the first holding part 31 to cutting of the tape-like solder material 21 by the cutting part 33 in the solder cutting device 3 shown in FIG. 5.

As shown in FIG. 9, in the solder cutting device 3, the tape-like solder material 21 is cut into a solder piece 211 of a predetermined length through steps from state ST91 to state ST98. State ST91 shows a state in which the first holding member 311 and the second holding member 312 are open. State ST92 shows a state in which the tape-like solder material 21 is fed in. State ST93 shows a state in which the first holding member 311 and the second holding member 312 are closed and the tape-like solder material 21 is sandwiched. State ST94 shows a state in which the first holding member 311 and the second holding member 312 are opened. State ST95 shows a state in which the first holding part 31 is moved backward together with the unit. State ST96 shows a state in which the first holding member 311 and the second holding member 312 are closed and the tape-like solder material 21 is sandwiched again. State ST97 shows a state in which the first holding part 31 is moved forward together with the unit. State ST98 shows a state in which the tip of the tape-like solder material 21 is cut by the upper blade 331 and the lower blade 332, and the solder piece 211 is cut out. After state ST98, the process returns to the step of state ST94 in order to cut out a new solder piece 211 from the tape-like solder material 21, and the steps from state ST94 to state ST98 are repeated in sequence.

(Solder Piece Manufacturing Device 12)

As shown in FIG. 1, the solder piece manufacturing device 12 includes the solder cutting unit 4 and the solder supply unit 2. That is, the solder piece manufacturing device 12 includes: the platform 11; the solder cutting unit 4, attached to the platform 11 and cutting a continuous tape-like solder material 21 at a predetermined length into a solder piece; and the solder supply unit 2, supplying the continuous tape-like solder material 21 to the solder cutting unit 4. Accordingly, in the solder piece manufacturing device 12, during manufacture of the solder piece, since the tape-like solder material 21 can be easily replaced or newly supplied, the solder piece can be efficiently manufactured.

In the solder piece manufacturing device 12 of the above configuration, the solder cutting unit 4 is configured to include the identification mechanism (identification member) 261 identifying a reel width of a reel by detecting the marking portion 262b. Accordingly, in the solder piece manufacturing device 12, in the case of replacing the solder cutting unit 4, even if the base member 22 of the solder cutting unit 4 is attached or removed, the solder cutting unit 4 is able to identify the reel width of the reel by detecting the marking portion 262b by the identification mechanism (identification member) 261.

In the solder piece manufacturing device 12 of the above configuration, in the solder supply unit 2, at least one of the support member 24 and the guidance member 25 has the identification area 26 in a portion thereof. In the identification area 26, the predetermined marking portion 262b corresponding to each of a plurality of reel widths of the reel held by the reel holder 23 is provided. The solder cutting unit 4 is configured to include the identification mechanism (identification member) 261 identifying the reel width of the reel by detecting the marking portion 262b. Accordingly, similarly, in the solder piece manufacturing device 12, in the case of replacing the solder cutting unit 4, even if the base member 22 of the solder cutting unit 4 is attached or removed, the solder cutting unit 4 is able to identify the reel width of the reel by detecting the marking portion 262b by the identification mechanism (identification member) 261.

In the solder piece manufacturing device 12, the frame 38 is provided on the platform 11, the base member 22 is supported by the movement mechanism 28, and is provided on the platform 11 so that the solder supply unit 2 is movable in the first direction between the attachment position S and the detachment position R. The identification area 26 is provided on the platform 11. In the solder piece manufacturing device 12, the reel holder 23 and the support member 24 are provided on the base member 22, the guidance member 25 is provided on the support member 24, and are integrally configured. Accordingly, in the solder piece manufacturing device 12, in the case of replacing the solder supply unit 2, the solder supply unit 2 can be efficiently attached and detached by attachment and removal of the base member 22 of the solder supply unit 2. In the solder piece manufacturing device 12, in the case of replacing the solder supply unit 2 corresponding to various types of tape-like solder materials 21, since the solder cutting unit 4 has a common configuration for shared use, the solder supply unit 2 corresponding to a plurality of types can be efficiently replaced.

(Part Mounting Device 5)

(A) of FIG. 10 is a prospective sectional view showing a state of the part mounting device 5 cut along the first direction (feeding direction), and (B) of FIG. 10 is a perspective view of the part mounting device 5 of (A) of FIG. 10 as viewed from a direction of an arrow 10B.

As shown in (A) of FIG. 10 and (B) of FIG. 10, the part mounting device 5 is a so-called mounter, and includes the platform 11, a solder cutting unit group 51, a mounting support 52, and the transfer unit 54. The part mounting device 5 includes an imaging part 58. The part mounting device 5 includes a first conveyance device 53.

The platform 11 includes a leg 11a, a mounting part 11b, a support 11c and a base 11d. The base 11d is a flat plate-shaped member located in a lower part of the platform 11. The leg 11a is a plurality of columnar members provided on the base 11d and supports the mounting part 11b. The mounting part 11b is a flat plate-shaped member on which the solder supply unit 2 and the solder cutting unit 4 are mounted. The support 11c is provided to the left and right of the solder supply unit 2 and the solder cutting unit 4 on the mounting part 11b in the width direction, and supports the transfer unit 54.

As shown in (A) of FIG. 10 and (B) of FIG. 10, in the part mounting device 5, a plurality of solder supply units 2 and solder cutting devices 3 (solder cutting units 4) provided in the solder piece manufacturing device 12 are disposed side by side in the width direction on the platform 11 (mounting part 11b). In detail, on the platform 11 (mounting part 11b), a mounting reception member 51a having a flat plate shape is provided, and the solder piece manufacturing device 12 is provided on the mounting reception member 51a.

The solder cutting unit group 51 has a configuration in which a plurality of solder cutting units 4 are detachably disposed in parallel on the platform 11. In the solder cutting unit group 51, a first solder cutting unit group 511 is disposed on one side in the width direction, and a second solder cutting unit group 512 is disposed on the other side in the width direction. The first solder cutting unit group 511 is supplied with a plurality of types of tape-like solder materials 21 and manufactures a solder piece required for the mounting object 56. Similarly, the second solder cutting unit group 512 is supplied with the tape-like solder material 21 of the same type as the first solder cutting unit group 511 and manufactures a solder piece required for the mounting object 56. By manufacturing the same type of solder piece by the first solder cutting unit group 511 and the second solder cutting unit group 512, even if the manufacture of the solder piece by the first solder cutting unit group 511 is interrupted, it is possible to manufacture the same type of solder piece by the second solder cutting unit group 512 as a backup, and the solder piece can be continuously mounted on the mounting object 56 in the part mounting device 5 without stops.

The mounting support 52 is provided on the platform 11 and supports the mounting object 56 (see FIG. 11) being a workpiece mounted with the solder piece 211 cut from the tape-like solder material 21. The mounting object 56 may be a tray accommodating a plurality of solder pieces 211. In (A) of FIG. 10 and (B) of FIG. 10, the mounting support 52 is indicated by a dotted ellipse. In the present embodiment, the mounting support 52, for example, corresponds to a positioning unit (including one engaged with a positioning pin configured on a mounting table) configured in the middle of a conveyor.

The first conveyance device 53 is provided on the platform 11, conveys the mounting object 56 before mounting of the solder piece 211 to the mounting support 52, and conveys the mounting object 56 of the mounting support 52 after mounting of the solder piece 211 to the outside of the mounting support 52. As the first conveyance device 53, a conveyor including an endless moving member (for example, a chain or a belt), or a conveyor in which a plurality of rollers are arranged, or a moving unit holding and moving the mounting object 56, or the like, is adopted. In detail, on the platform 11 (mounting part 11b), the mounting reception member 53a having a flat plate shape is provided, and the first conveyance device 53 is provided on the mounting reception member 53a.

The transfer unit 54 transfers and mounts each solder piece 211 obtained by cutting by the solder cutting unit group 51 to the mounting object 56 of the mounting support 52. The transfer unit 54 specifically includes a transfer head unit 541 and a head support 542. The head support 542 supports the transfer head unit 541, is provided across two supports 11c and 11c provided separated from each other, and is movable in the X direction (feeding direction (first direction)). The transfer head unit 541 is movable in a third direction being a Y direction orthogonal to the X direction. The transfer head unit 541 includes a plurality of (two in the present embodiment) holding units 5411 holding the solder piece 211 (see FIG. 9) and movable in the second direction (up-down direction) being the Z direction orthogonal to the X direction and the Y direction. Accordingly, the transfer unit 54 holds the solder piece 211 on the cut piece holding part 371 and transfers the solder piece 211 to the mounting object 56 of the mounting support 52.

The imaging part 58 is provided between the solder cutting device 3 and the mounting support 52, images from below the solder piece held in the solder head unit 541 of the transfer unit 54, and calculates a correction value being a positional error in an XY direction with respect to a predetermined reference position and a posture error about an Z direction axis with respect to a predetermined reference posture. The imaging part 58 includes an imaging unit including a camera and a light source unit serving as a light source during imaging.

In the part mounting device 5 configured in this way, by adopting the solder piece manufacturing device 12 including the solder cutting unit 4 and the solder supply unit 2 of the present invention, the area occupied by the part mounting device 5 in the width direction can be reduced, and an installation location can be effectively utilized. Since the movement distance by the transfer unit 54 is reduced, the solder piece can be efficiently mounted. In the part mounting device 5, since the tape-like solder material 21 can be easily replaced, it is possible to continuously and efficiently mount the solder piece 211 on the mounting object 56.

(Production System 1)

(A) of FIG. 11 to (E) of FIG. 11 are schematic views showing each type of the part mounting device 5. In the part mounting device 5 of a standard type T0, the mounting support 52 is provided within an area of the part mounting device 5 and positions and supports the mounting object 56 within the area of the part mounting device 5. Transfer of the mounting object 56 to the mounting support 52 within the area of the part mounting device 5 or transfer of the mounting object 56 from the mounting support 52 within the area of the part mounting device 5 is performed by a transfer device (not shown) or an operator.

The part mounting device 5 of type T1 is a type in which the first conveyance device 53 is configured in the part mounting device 5 of the standard type T0. In the part mounting device 5 of type T1, the first conveyance device 53 is provided within the area of the part mounting device 5 and transfers the mounting object 56 within the area of the part mounting device 5. The mounting support 52 is provided in the middle of the first conveyance device 53, and the mounting object 56 is transferred to the mounting support 52 and from the mounting support 52. The first conveyance device 53 receives and transfers the mounting object 56 from the outside of the area of the part mounting device 5, and delivers and transfers the mounting object 56 to the outside of the area of the part mounting device 5.

The part mounting device 5 of type T2 is a type in which the first conveyance device 53 is configured in the part mounting device 5 of the standard type T0. In the part mounting device 5 of type T2, the first conveyance device 53 is provided so as to pass through the inside of the area of the part mounting device 5, and transfers the mounting object 56 between the inside and outside of the area of the part mounting device 5. The mounting support 52 is provided in the middle of the first conveyance device 53, and the mounting object 56 is transferred to the mounting support 52 and from the mounting support 52. The first conveyance device 53 receives and transfers the mounting object 56 from the outside of the area of the part mounting device 5, and delivers and transfers the mounting object 56 to the outside of the area of the part mounting device 5.

The part mounting device 5 of type T3 is a type in which the first conveyance device 53 is configured in the part mounting device 5 of the standard type T0. In the part mounting device 5 of type T3, the first conveyance device 53 is provided so as to pass through the inside of the area of the part mounting device 5, and transfers the mounting object 56 between the inside and outside of the area of the part mounting device 5. The mounting support 52 is provided within the area of the part mounting device 5 in a direction intersecting a transfer direction of the first conveyance device 53, and the mounting object 56 is transferred between the mounting support 52 and the first conveyance device 53 by a mounting object transfer mechanism (not shown). The first conveyance device 53 receives and transfers the mounting object 56 from the outside of the area of the part mounting device 5, and delivers and transfers the mounting object 56 to the outside of the area of the part mounting device 5.

A configuration (type T3-1) may be adopted in which a second conveyance device 55 (described later) in place of the first conveyance device 53 of the part mounting device 5 of type T3 is disposed outside the area of the part mounting device 5 and adjacent to the part mounting device 5 (type T3-1). The part mounting device 5 of type 3-1 is a type in which the second conveyance device 55 is added to the part mounting device 5 of the standard type T0. In the part mounting device 5 of type T3-1, the second conveyance device 55 is provided so as to convey the mounting object 56 along the inside of the area of the part mounting device 5 while being adjacent to the inside of the area. The mounting support 52 is provided within the area of the part mounting device 5 in a direction intersecting a transfer direction of the second conveyance device 55, and the mounting object 56 is transferred between the mounting support 52 and the second conveyance device 55 by the mounting object transfer mechanism (not shown).

(A) of FIG. 12 to (D) of FIG. 12 are schematic views showing the production system 1 including each type of the part mounting device 5 shown in (A) of FIG. 11 to (E) of FIG. 11. The production system 1 includes the temperature processing device 57 that performs temperature processing on the mounting object 56 mounted with the solder piece 211. In (A) of FIG. 12 to (D) of FIG. 12, the solder piece manufacturing device 12 including the solder supply unit 2 and the solder cutting device 3 (solder cutting unit 4) as well as the transfer unit 54 are omitted.

The production system 1 shown in (A) of FIG. 12 includes the part mounting device 5 of type T1 and the temperature processing device 57. The production system 1 includes a plurality of part mounting devices 5, and the second conveyance device (mounting object transfer device) 55 that conveys the mounting object 56 between the part mounting devices 5, conveys the mounting object 56 within the area of the part mounting device 5, conveys the mounting object 56 to the part mounting device 5 and the temperature processing device 57, and conveys the mounting object 56 to the present production system 1. In the present production system 1, the part mounting device 5 of type T1 is disposed so that a conveyance path of the mounting object 56 is formed continuously (in a straight line in (A) of FIG. 12). In the present embodiment, the conveyance path is formed by connecting the first conveyance device 53 configured in the part mounting device 5 of type T1 and the second conveyance device 55.

The part mounting device 5 disposed in a broken line portion of the present production system 1 may be either the part mounting device 5 of the standard type T0 or the part mounting device 5 of type T1. For example, when the part mounting device 5 is installed in advance, the part mounting device 5 disposed in the broken line portion may be composed of the part mounting device 5 of type T1; when the part mounting device 5 is configured in a portion of the second conveyance device 55 configured in advance, the part mounting device 5 disposed in the broken line portion may be composed of the part mounting device 5 of the standard type T0.

The production system 1 shown in (B) of FIG. 12 includes the part mounting device 5 of type T2 and the temperature processing device 57. The present production system 1 includes a plurality of part mounting devices 5, and conveyance of the mounting object 56 between the part mounting devices 5, conveyance of the mounting object 56 within the area of the part mounting device 5, and conveyance of the mounting object 56 to the part mounting device 5 and the temperature processing device 57 are performed by the first conveyance device 53 included in the part mounting device 5 of type T2. In the present production system 1, the part mounting device 5 of type T2 is disposed so that the conveyance path of the mounting object 56 is formed continuously (in a straight line in (B) of FIG. 12), and the conveyance path is formed by connecting the first conveyance devices 53 configured in each part mounting device 5 to each other.

The production system 1 shown in (C) of FIG. 12 includes the part mounting device 5 of type T3 and the temperature processing device 57. The present production system 1 includes a plurality of part mounting devices 5, and conveyance of the mounting object 56 between the part mounting devices 5 is performed by the first conveyance device 53 configured in each part mounting device 5. The present production system 1 includes the temperature processing device 57, and the second conveyance device 55 that conveys the mounting object 56 to the present production system 1. In the present production system 1, the part mounting device 5 of type T3 is disposed so that the conveyance path of the mounting object 56 is formed continuously (in a straight line in (C) of FIG. 12), and the conveyance path is formed by connecting the first conveyance device 53 configured in the part mounting device 5 and the second conveyance device 55.

The production system 1 shown in (D) of FIG. 12 includes the part mounting device 5 of the standard type T0 and the temperature processing device 57. The present production system 1 includes a plurality of part mounting devices 5, and the second conveyance device 55 that conveys the mounting object 56 to each part mounting device 5 and conveys the mounting object 56 to the temperature processing device 57. In the present production system 1, the second conveyance device 55 is provided so that the conveyance path of the mounting object 56 is formed continuously (in a straight line in (D) of FIG. 12), and the part mounting device 5 and the temperature processing device 57 are disposed along the conveyance path on one side of the second conveyance device 55. In the present production system 1, since the part mounting device 5 and the temperature processing device 57 are disposed side by side along the conveyance path of the second conveyance device 55, the part mounting device 5 and the temperature processing device 57 can be easily increased or decreased according to production capacity of the production system 1.

As described above, the production system 1 can be configured by the part mounting device 5, the temperature processing device 57 and the second conveyance device 55. In this configuration, in the case of replacing the solder supply unit 2 attached to the solder cutting device 3, the solder supply unit 2 can be attached and detached by attachment and removal of the base member 22. As a result, operation efficiency of the entire production system 1 is improved.

Embodiment 2

Another embodiment of the present invention will be described below. For convenience of description, members having the same functions as those described in Embodiment 1 above are denoted by the same reference numerals, and description thereof will not be repeated. In the present embodiment, the production system 1 includes a solder supply unit 6 in place of the solder supply unit 2, and includes a solder cutting device 7 in place of the solder cutting device 3. Other configurations of the production system 1 are the same as those of Embodiment 1.

(Solder Supply Unit 6)

(A) of FIG. 13 is a perspective view showing a shape of an upper surface of a lower guide member 611 of a guidance member 61 provided in the solder supply unit 6 of the present embodiment, and showing a state in which an attachment guide member 73 is attached to the lower guide member 611. (B) of FIG. 13 is a perspective view showing a shape of a lower surface of the lower guide member 611 of the guidance member 61, and showing a state in which the attachment guide member 73 is attached to the lower guide member 611. As shown in (A) of FIG. 13 and (B) of FIG. 13, the solder supply unit 6 includes the guidance member 61 in place of the guidance member 25 of the solder supply unit 2. Other configurations of the solder supply unit 6 are the same as those of the solder supply unit 2.

(Guidance Member 61)

As shown in (A) of FIG. 13 and (B) of FIG. 13, the guidance member 61 includes the lower guide member 611 and an upper guide member 612 extending in the feeding direction. The lower guide member 611 and the upper guide member 612 have a configuration corresponding to the lower guide member 251 and the upper guide member 252 of the solder supply unit 2. The lower guide member 611 includes a guideway 6111, an extension portion 6112 and a guidance side wall 6113 on the upper surface. The guideway 6111 corresponds to the guideway 2511 of the lower guide member 251, the extension portion 6112 corresponds to the extension portion 2512 of the lower guide member 251, and the guidance side wall 6113 corresponds to the guidance side wall 2513 of the lower guide member 251. The upper guide member 612 has the same shape as the upper guide member 252 of the solder supply unit 2 and includes an opening 6121 corresponding to the opening 2521.

An opening 6114 is formed in the lower guide member 611 of the guidance member 61. The opening 6114 extends toward the upstream side from a downstream end of the lower guide member 611. An upstream end of the opening 6114 is at the same position as an upstream end of the first opening 2516 of the lower guide member 251. The opening 6114 is able to receive a first gripper and a second gripper of the solder cutting device 7 that are inserted from below.

A formation range of the opening 6114, for example, matches a formation range of the opening 6121 of the upper guide member 612.

The lower guide member 611 includes a tip 611*b*, two inclined parts 611*b*1 and 611*b*1, two lower tips 611*b*2 and 611*b*2, and two side tips 611*c*1 and 611*c*1. The tip 611*b* corresponds to the tip 251*b* of the lower guide member 251, the inclined part 611*b*1 corresponds to the inclined part 251*b*1 of the lower guide member 251, the lower tip 611*b*2 corresponds to the lower tip 251*b*2 of the lower guide member 251, and the side tip 611*c*1 corresponds to the side tip 251*c*1 of the lower guide member 251. Functions of the above parts of the guidance member 61 are the same as the functions of the corresponding parts of the guidance member 25.

In the case where the solder supply unit 6 is attached to the solder cutting device 7, the attachment guide member 73 included in the solder cutting device 7 is inserted into the opening 6114 from the tip 611*b*, and guides the lower guide member 611 until reaching an attachment position. Accordingly, when the solder supply unit 6 is attached to the solder cutting device 7, the tip 611*b* of the guidance member 61 is attached in a predetermined position by being guided by the guidance defining part 338, and an upper surface of the attachment guide member 73 and a surface of the extension portion 6112 can be set at the same height position. Accordingly, the tape-like solder material 21 fed out by the guidance member 61 can be accurately fed out and set in a cutting position of the solder cutting device 7. The solder supply unit 6 has the same advantages as the solder supply unit 2.

(Solder Cutting Device 7)

FIG. 14 is a perspective view of the solder cutting device 7. FIG. 15 is a front view of the solder cutting device 7. As shown in FIG. 14 and FIG. 15, the solder cutting device 7 includes a first holding part 71 in place of the first holding part 31 of the solder cutting device 3 and a second holding part 72 in place of the second holding part 35. Other configurations of the solder cutting device 7 are the same as those of the solder cutting device 3.

(First Holding Part 71)

(A) of FIG. 16 is a side view of the first holding part 71 and the second holding part 72 shown in FIG. 14 and FIG. 15, and (B) of FIG. 16 is a partially enlarged perspective view of the first holding part 71 and the second holding part 72. As shown in (A) of FIG. 16 and (B) of FIG. 16, like the first holding part 31 of Embodiment 1, in Embodiment 2, the first holding part 71 includes a first holding member 711 and a second holding member 712 as well as a first holding drive part 713, and holds and releases the tape-like solder material 21. However, in the first holding part 71, the first holding member 711 is a moving member able to operate in the up-down direction, and the second holding member 712 is a fixed member that is fixed without movement in the up-down direction. Accordingly, the first holding drive part 713 actuates only the first holding member 711 in the second direction (Z direction) perpendicular to the plane part of the tape-like solder material 21.

The first holding drive part 713 includes a third actuator 7131 corresponding to the third actuator 3131 of the first holding drive part 313 of Embodiment 1, a transmission mechanism 7133 corresponding to the transmission mechanism 3133 of the first holding drive part 313 of Embodiment 1, and a holding moving body 7132 corresponding to the holding moving body 3132 of Embodiment 1. The transmission mechanism 7133 converts a linear motion of the holding moving body 7132 in the first direction (X direction)

into a linear motion in the second direction (Z direction), and transmits the same as a linear motion of the first holding member 711 in the second direction (Z direction).

Specifically, the transmission mechanism 7133 includes an upper chuck mechanism 7134 corresponding to the upper chuck mechanism 3134 of Embodiment 1, an upper follower part 7135 corresponding to the upper follower part 3135 of Embodiment 1, and a spring 7138 corresponding to the upper elastic member 3138 of Embodiment 1. An operation of the transmission mechanism 7133 for actuating the upper chuck mechanism 7134 is the same as that of the transmission mechanism 3133 of Embodiment 1. Like the first holding part 31 of Embodiment 1, the first holding part 71 may have various configurations depending on the application or combination of conventionally known techniques. Nonetheless, the first holding part 71 is not particularly limited to the configuration disclosed above if the tape-like solder material 21 can be held and released.

(Second Holding Part 72)

As shown in (A) of FIG. 16 and (B) of FIG. 16, the second holding part 72 includes a first holding member 721 corresponding to the first holding member 351 of the second holding part 35 of Embodiment 1 and a second holding drive part 723 corresponding to the second holding drive part 353 of Embodiment 1, and holds and releases the tape-like solder material 21.

In the second holding part 72, the attachment guide member 73 functions as a second holding member (second gripper) in place of the second holding member 352 of the second holding part 35 of Embodiment 1. The attachment guide member 73 is provided in the cutting part 33, and extends in a direction opposite to the feeding direction. The second holding drive part 723 actuates the first holding member 721 in the second direction (Z direction) perpendicular to the plane part of the tape-like solder material 21.

The second holding drive part 723 includes a fourth actuator 7231 corresponding to the fourth actuator 3531 of the second holding drive part 353 of Embodiment 1, and a transmission mechanism 7233 corresponding to the transmission mechanism 3533 of the second holding drive part 353 of Embodiment 1. The transmission mechanism 7233 includes an upper chuck mechanism 7234 corresponding to the upper chuck mechanism 3534 of the transmission mechanism 3533 of Embodiment 1. The upper chuck mechanism 7234 includes the first holding member 721 and a spring 7235. The spring 7235 energizes the first holding member 721 downward.

The upper chuck mechanism 7234 rises with upward movement of a moving body (not shown) of the fourth actuator 7231 when the fourth actuator 7231 operates, and when the fourth actuator 7231 stops operating and the moving body (not shown) of the fourth actuator 7231 moves downward, the upper chuck mechanism 7234 is energized by the spring 7235 to lower with the moving body (not shown) of the fourth actuator 7231. The first holding member 721 moves the tape-like solder material 21 downward by lowering, and holds the tape-like solder material 21 in the guidance member 61 together with the attachment guide member 73 by being pressed against the attachment guide member 73.

Accordingly, it is possible to hold and release the tape-like solder material 21 by the first holding member 721 and the attachment guide member 73. Other operations of the second holding part 72 are the same as those of the second holding part 35 of Embodiment 1. Like the second holding part 35 of Embodiment 1, the second holding part 72 may have various configurations depending on the application or combination of conventionally known techniques. Nonetheless, the second holding part 72 is not particularly limited to the configuration disclosed above if the tape-like solder material 21 can be held and released.

(Advantages of Solder Cutting Device 7)

The solder cutting device 7 has a configuration in which only the first holding member 711 is raised and lowered in the first holding part 71, and only the first holding member 721 is raised and lowered in the second holding part 72. Accordingly, it is possible to simplify the configuration of the first holding drive part 713 of the first holding part 71 and the second holding drive part 723 of the second holding part 72.

If the solder supply unit 6 is attached to the solder cutting device 7, as shown in (A) of FIG. 13 and (B) of FIG. 13, the second holding member 712 of the first holding part 71 and the attachment guide member 73 are inserted into the opening 6114 of the lower guide member 611 of the guidance member 61, and these function to guide the lower surface of the tape-like solder material 21. Accordingly, the tape-like solder material 21 can be stably guided. Other advantages of the solder cutting device 7 are the same as those of the solder cutting device 3 of Embodiment 1.

[Conclusion]

A solder cutting device according to one aspect of the present invention includes: a first holding part, holding and releasing a long tape-like solder material; a first drive part, equipped with the first holding part and causing the tape-like solder material held by the first holding part to be sent linearly in a first direction; a cutting part, including a first cutting member and a second cutting member that face each other and are provided so as to approach and separate from each other, and cutting the tape-like solder material located in a cutting position between the first cutting member and the second cutting member; and a second drive part, actuating at least one of the first cutting member and the second cutting member in a second direction perpendicular to a plane part of the tape-like solder material. The first drive part is a first actuator being electrically-driven and converting a rotational motion of a rotating body whose axis extends in the first direction into a linear motion in the first direction. The second drive part includes a second actuator linearly moving a moving body movable in the first direction, and a transmission mechanism converting the linear motion of the moving body into a linear motion in the second direction and transmitting the same to at least one of the first cutting member and the second cutting member.

According to the above configuration, in the solder cutting device, it is possible to reduce the width in the direction orthogonal to the first direction and the second direction without a drive shaft or drive part moving in the direction orthogonal to the first direction and the second direction. Such an effect is realized in particular by the first drive part being the first actuator, and the second drive part including the moving body, the second actuator and the transmission mechanism. Accordingly, in a system including the solder cutting device and using the solder piece supplied from the solder cutting device, when a plurality of solder cutting devices that supply solder pieces of different sizes are installed, the area occupied by the solder cutting devices can be reduced.

The present invention is not limited to the embodiments described above, and may be modified in various ways within the scope of the claims. An embodiment derived from a proper combination of technical means disclosed in respective different embodiments is also encompassed in the technical scope of the present invention.

What is claimed is:

1. A solder cutting device, comprising:
a first holding part, holding and releasing a long tape-like solder material;
a first drive part, equipped with the first holding part and causing the tape-like solder material held by the first holding part to be sent linearly in a first direction;
a cutting part, comprising a first cutting member and a second cutting member that face each other and are provided so as to approach and separate from each other, and cutting the tape-like solder material located in a cutting position between the first cutting member and the second cutting member; and
a second drive part, actuating either one of the first cutting member and the second cutting member in a second direction perpendicular to a plane part of the tape-like solder material,
wherein
the first drive part is a first actuator being electrically-driven and converting a rotational motion into a linear motion in the first direction; and
the second drive part comprises a second actuator linearly moving a moving body movable in the first direction, and a first transmission mechanism converting the linear motion of the moving body into a linear motion in the second direction and transmitting the same to either one of the first cutting member and the second cutting member.

2. The solder cutting device according to claim 1, wherein
the first transmission mechanism is a plane cam mechanism; and
the first transmission mechanism comprises a plane cam configured in the moving body, a cam follower abutting against a cam surface of the plane cam, and a connection member supporting the cam follower and connected to either one of the first cutting member and the second cutting member.

3. The solder cutting device according to claim 1, wherein
the first holding part comprises:
a first holding member and a second holding member, facing each other and provided so as to approach and separate from each other; and
a first holding drive part, actuating either one of the first holding member and the second holding member in the second direction perpendicular to the plane part of the tape-like solder material, wherein
the first holding drive part comprises a third actuator comprising a holding moving body movable in the first direction and linearly moving the holding moving body, and a second transmission mechanism converting the linear motion of the holding moving body into a linear motion in the second direction and transmitting the same to either one of the first holding member and the second holding member.

4. The solder cutting device according to claim 2, comprising a cleaning unit that cleans at least one of the cam surface and the cam follower.

5. The solder cutting device according to claim 1, further comprising:
a second holding part, provided between the first holding part and the cutting part, and holding and releasing the tape-like solder material to be cut.

6. The solder cutting device according to claim 1, further comprising:
a cut solder transfer part, comprising:
a cut piece holding part, receiving and holding in a cutting support position a solder piece cut from the tape-like solder material; and
a cut piece holding drive part, moving the cut piece holding part between the cutting support position and a takeout position separated from the cutting support position, the takeout position being where the solder piece is taken out.

7. A solder cutting unit, comprising:
a frame, equipped with the first holding part, the first drive part, the cutting part, the second drive part and the second holding part in the solder cutting device according to claim 5, wherein
the second actuator and the first transmission mechanism are provided in a first layer being a lowermost layer of the frame;
the tape-like solder material is sent above the first layer, and the first holding part, the first drive part, the cutting part and the second holding part are provided between the sent tape-like solder material and the first layer.

8. The solder cutting unit according to claim 7, wherein
the frame comprises, in the first layer, a lower base portion provided with the second actuator and the first transmission mechanism;
the tape-like solder material is sent above the first layer;
the frame comprises, between the sent tape-like solder material and the first layer, an upper base portion provided with the first actuator and the second holding part, wherein
the upper base portion and the lower base portion each comprise a connection portion connected to each other on one side in the first direction;
the first actuator is provided on the upper base portion on the other side away from the connection portion; and
the second actuator is provided on the lower base portion on the other side away from the connection portion.

9. A solder cutting unit, wherein
the solder cutting device according to claim 1 further comprises:
a second holding part, provided between the first holding part and the cutting part, and holding and releasing the tape-like solder material to be cut; and
a cut solder transfer part, comprising:
a cut piece holding part, receiving and holding in a cutting support position a solder piece cut from the tape-like solder material; and
a cut piece holding drive part, moving the cut piece holding part between the cutting support position and a takeout position separated from the cutting support position, the takeout position being where the solder piece is taken out, and wherein
the solder cutting unit comprises a frame equipped with the first holding part, the first drive part, the cutting part, the second drive part, the second holding part and the cut solder transfer part in the solder cutting device according to claim 1;
the first holding part, the first drive part, the cutting part, the second drive part and the second holding part are provided on a supply processing side where the tape-like solder material is supplied; and
the cut solder transfer part is provided on a takeout side where the solder piece obtained by cutting is taken out.

10. A part mounting device, comprising:
a platform;
a solder cutting unit group, detachably arranged on the platform and having a plurality of the solder cutting units according to claim 7 disposed in parallel;

a mounting support, provided on the platform and supporting a mounting object mounted with a solder piece cut from the tape-like solder material;
a first conveyance device, provided on the platform and conveying the mounting object; and
a transfer unit, transferring and mounting each of the solder piece obtained by cutting by the solder cutting unit group to the mounting object of the mounting support.

11. The part mounting device according to claim 10, further comprising:
a second conveyance device, provided on the platform and conveying the mounting object in the mounting support and outside the mounting support.

12. A production system, performing temperature processing on a mounting object mounted with a solder piece cut from a tape-like solder material, comprising:
the part mounting device according to claim 10;
a temperature processing device, performing temperature processing on a mounted mounting object; and
a mounting object transfer device, transferring the mounting object in the part mounting device and the temperature processing device.

* * * * *